US011150298B1

(12) United States Patent
Bingham et al.

(10) Patent No.: US 11,150,298 B1
(45) Date of Patent: Oct. 19, 2021

(54) CONVERTING FORMAL VERIFICATION TESTBENCH DRIVERS WITH NONDETERMINISTIC INPUTS TO SIMULATION MONITORS

(71) Applicant: International Business Machines Corporation, Armonk, NY (US)

(72) Inventors: Bradley Donald Bingham, Austin, TX (US); Viresh Paruthi, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/118,696

(22) Filed: Dec. 11, 2020

(51) Int. Cl.
  *G06F 11/22* (2006.01)
  *G06F 17/50* (2006.01)
  *G01R 31/3183* (2006.01)
  *G01R 31/319* (2006.01)

(52) U.S. Cl.
  CPC ........... *G01R 31/318357* (2013.01); *G01R 31/31917* (2013.01); *G01R 31/318314* (2013.01); *G01R 31/318385* (2013.01)

(58) Field of Classification Search
  USPC ................... 714/718, 742; 716/136
  See application file for complete search history.

(56) References Cited

U.S. PATENT DOCUMENTS

| | | | | |
|---|---|---|---|---|
| 5,383,143 A | * | 1/1995 | Crouch | G01R 31/31813 708/254 |
| 5,442,640 A | * | 8/1995 | Bardell, Jr. | G11C 29/10 714/718 |
| 7,290,193 B2 | | 10/2007 | Kadkade et al. | |
| 8,181,134 B2 | | 5/2012 | Baumgartner et al. | |
| 9,280,496 B2 | | 3/2016 | Auerbach et al. | |
| 9,330,227 B1 | | 5/2016 | Han et al. | |

(Continued)

OTHER PUBLICATIONS

Grimm, T., et al., "A Survey on Formal Verification Techniques for Safety-Critical Systems-on-Chip", 2018, Electronics, vol. 7, No. 6, 81, pp. 1-27.

(Continued)

*Primary Examiner* — Brian Ngo
(74) *Attorney, Agent, or Firm* — Cantor Colburn LLP; Bryan Bortnick

(57) ABSTRACT

Techniques include configuring a sequential circuit monitor having been generated by applying a quantifier elimination to each random bit position of random inputs associated with a formal verification driver and selecting a value for random inputs to drive a next stage logic of sequential circuit simulation monitor, a state of the next stage logic being used by sequential circuit simulation monitor to generate sequential inputs to match those permitted by formal verification driver, formal verification driver being specified for a DUT input interface. An equivalence check between sequential circuit simulation monitor and original formal driver matches the same set of sequential inputs permitted original formal driver. The sequential circuit simulation monitor is coupled to a simulation environment and the DUT in simulation environment, sequential circuit simulation monitor being configured to flag an input sequence from the simulation environment not permitted by formal verification driver based on the sequential inputs.

20 Claims, 19 Drawing Sheets

(56) References Cited

U.S. PATENT DOCUMENTS

| | | | | |
|---|---|---|---|---|
| 2003/0053358 A1* | 3/2003 | Kundu | ................... | G11C 29/40 365/201 |
| 2005/0149789 A1* | 7/2005 | Driscoll | ........... | G01R 31/31919 714/724 |
| 2006/0129952 A1* | 6/2006 | Baumgartner | .......... | G06F 30/30 716/112 |
| 2006/0170445 A1* | 8/2006 | Driscoll | ........... | G01R 31/31716 714/742 |
| 2020/0267001 A1* | 8/2020 | Schwarz | ............... | H04L 9/3265 |
| 2020/0295781 A1* | 9/2020 | Slegel | ................. | H03M 13/015 |

OTHER PUBLICATIONS

Harry R. Lewis & Christos H. Papadimitriou, "Elements of the theory of computation", 1998, Second Edition, Theorem 2.2.1, 375 pages, Prentice-Hall.

Kuehlmann, A., et al., "Robust Boolean reasoning for equivalence checking and functional property verification", 2002, IEEE Transactions on Computer-Aided Design of Integrated Circuits and Systems, pp. 1-17.

Paruthi, V., "Large-scale Application of Formal Verification: From Fiction to Fact", Oct. 2010, In Formal Methods in Computer Aided Design, IEEE, pp. 175-180.

Yunshan Zhu & James H. Kukula, "Generator-based Verification", Nov. 2003, ICCAD '03: Proceedings of the 2003 IEEE/ACM international conference on Computer-aided design, pp. 146-153.

\* cited by examiner

RMUX Logic Table

| | MATCH0 | MATCH1 | r_out |
|---|---|---|---|
| ROW 1 | 0 | 0 | DC |
| ROW 2 | 0 | 1 | 1 |
| ROW 3 | 1 | 0 | 0 |
| ROW 4 | 1 | 1 | r_sel |

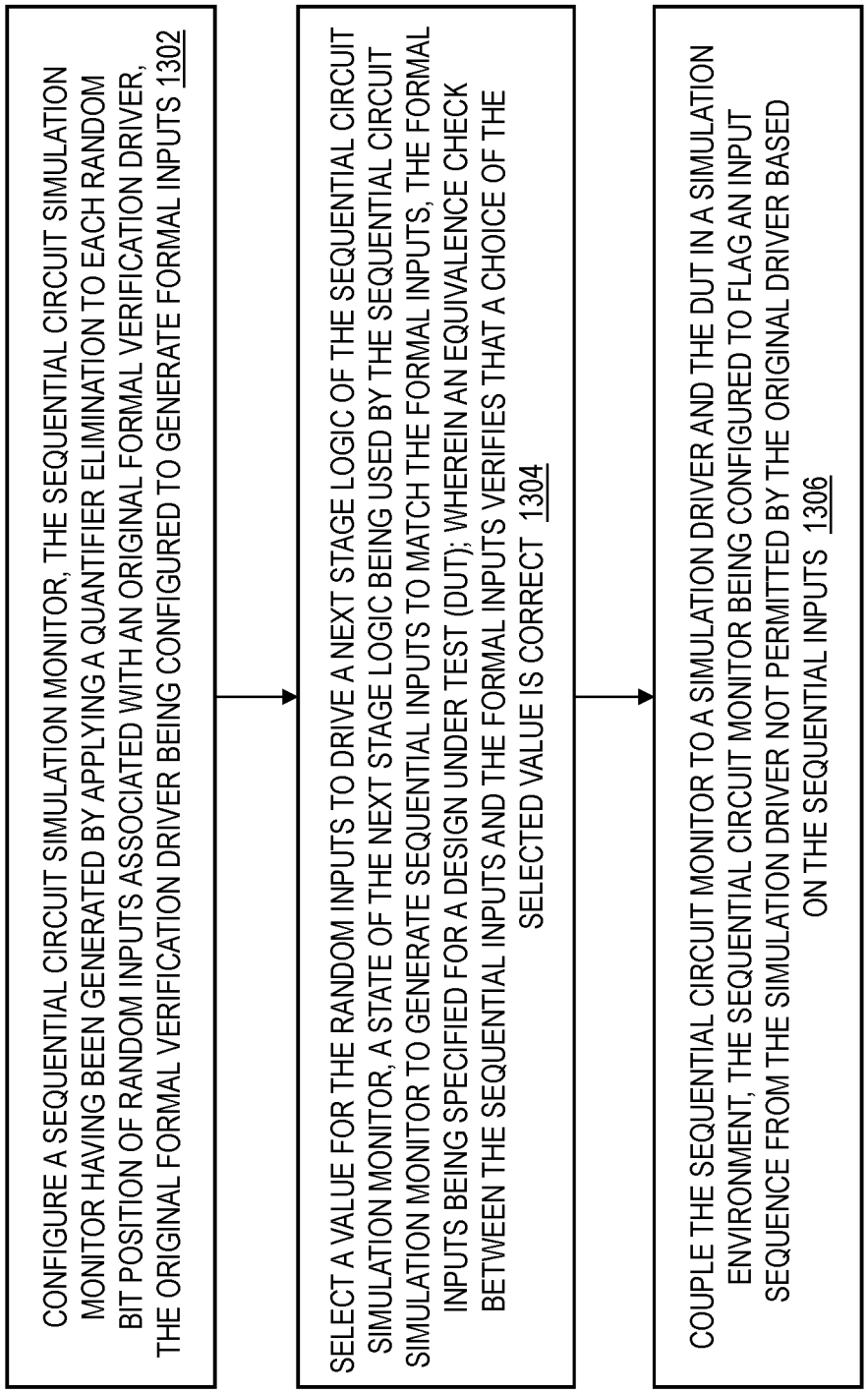

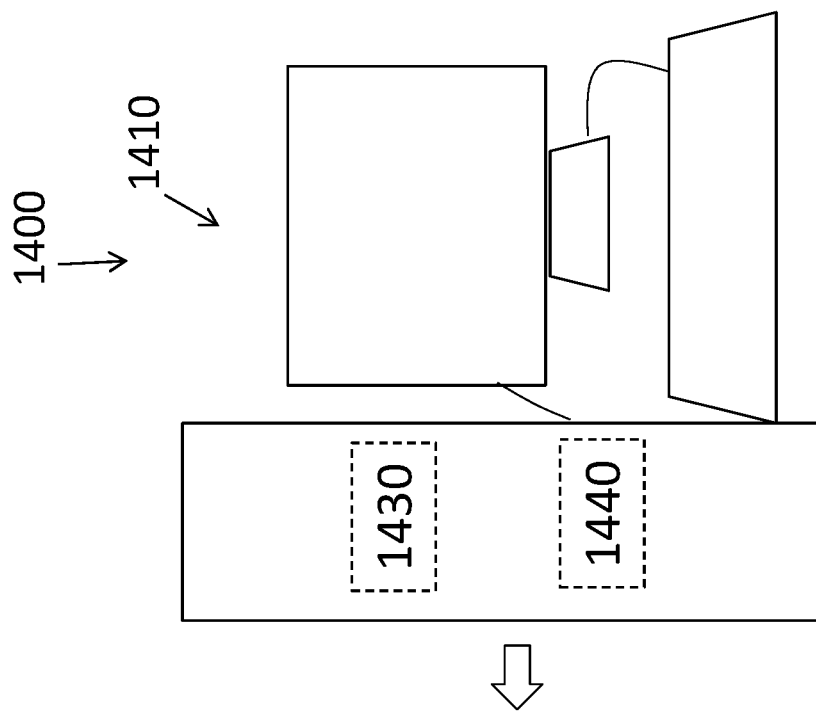
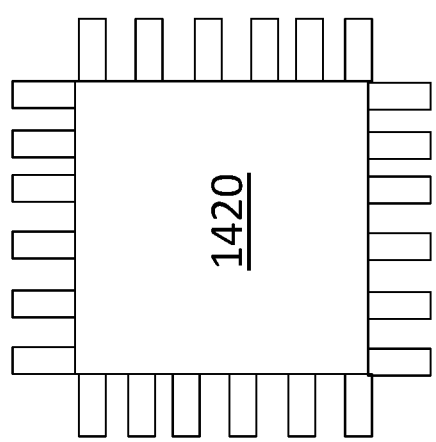
FIG. 14A

CONVERTING FORMAL VERIFICATION TESTBENCH DRIVERS WITH NONDETERMINISTIC INPUTS TO SIMULATION MONITORS

BACKGROUND

The present invention generally relates to computer systems, and more specifically, to computer systems, computer-implemented methods, and computer program products for converting formal verification drivers with nondeterministic inputs to simulation monitors.

In the context of hardware and software systems, formal verification is the act of proving or disproving the correctness of intended design underlying a system with respect to a certain formal specification or property. Formal verification can be helpful in proving the correctness of systems such as, for example, cryptographic protocols, combinational circuits, digital circuits with internal memory, and software expressed as source code. One approach and formation are model checking, which consists of a systematically exhaustive exploration of the mathematical model. This is possible for finite models, but also for some infinite models where infinite sets of states can be effectively represented finitely by using abstraction or taking advantage of symmetry. Usually, this consists of exploring all states and transitions in the model, by using smart and domain-specific abstraction techniques to consider whole groups of states in a single operation and reduce computing time. Implementation techniques include state space enumeration, symbolic state space enumeration, abstract interpretation, symbolic simulation, abstraction refinement, etc. The properties to be verified are often described in temporal logics, such as linear temporal logic (LTL), Property Specification Language (PSL), SystemVerilog Assertions (SVA), or computational tree logic (CTL).

SUMMARY

Embodiments of the present invention are directed to converting formal verification drivers with nondeterministic inputs to simulation monitors. A non-limiting example computer-implemented method includes configuring a sequential circuit simulation monitor for a design under test (DUT) input interface, the sequential circuit simulation monitor having been generated by applying a quantifier elimination to each random bit position of random inputs associated with an original formal verification driver, the original formal verification driver being configured to generate a set of nondeterministic inputs. The method includes selecting a value for the random inputs to drive a next stage logic of the sequential circuit simulation monitor, a state of the next stage logic being used by the sequential circuit simulation monitor to generate sequential inputs to match the nondeterministic inputs permitted by the original formal verification driver. A comparison for equivalent outputs between the sequential circuit simulation monitor and the formal verification driver verifies that the sequential circuit simulation monitor matches the set of the nondeterministic inputs permitted by the original formal verification driver. The method includes coupling the sequential circuit simulation monitor to a simulation environment and the DUT in the simulation environment, the sequential circuit simulation monitor being configured to flag an input sequence from the simulation environment not permitted by the original formal verification driver based on the sequential inputs.

Other embodiments of the present invention implement features of the above-described method in computer systems and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 8 depicts a logic table for a combinational logic multiplexer in accordance with one or more embodiments of the present invention;

FIG. 13 is a flowchart of a method for converting a formal verification driver with nondeterministic inputs to a simulation monitor with deterministic inputs in accordance with one or more embodiments of the present invention;

FIG. 14A is a block diagram of a system to fabricate the DUT having had its input monitored by the monitor during simulation according to one or more embodiments of the invention;

DETAILED DESCRIPTION

Figure 1:
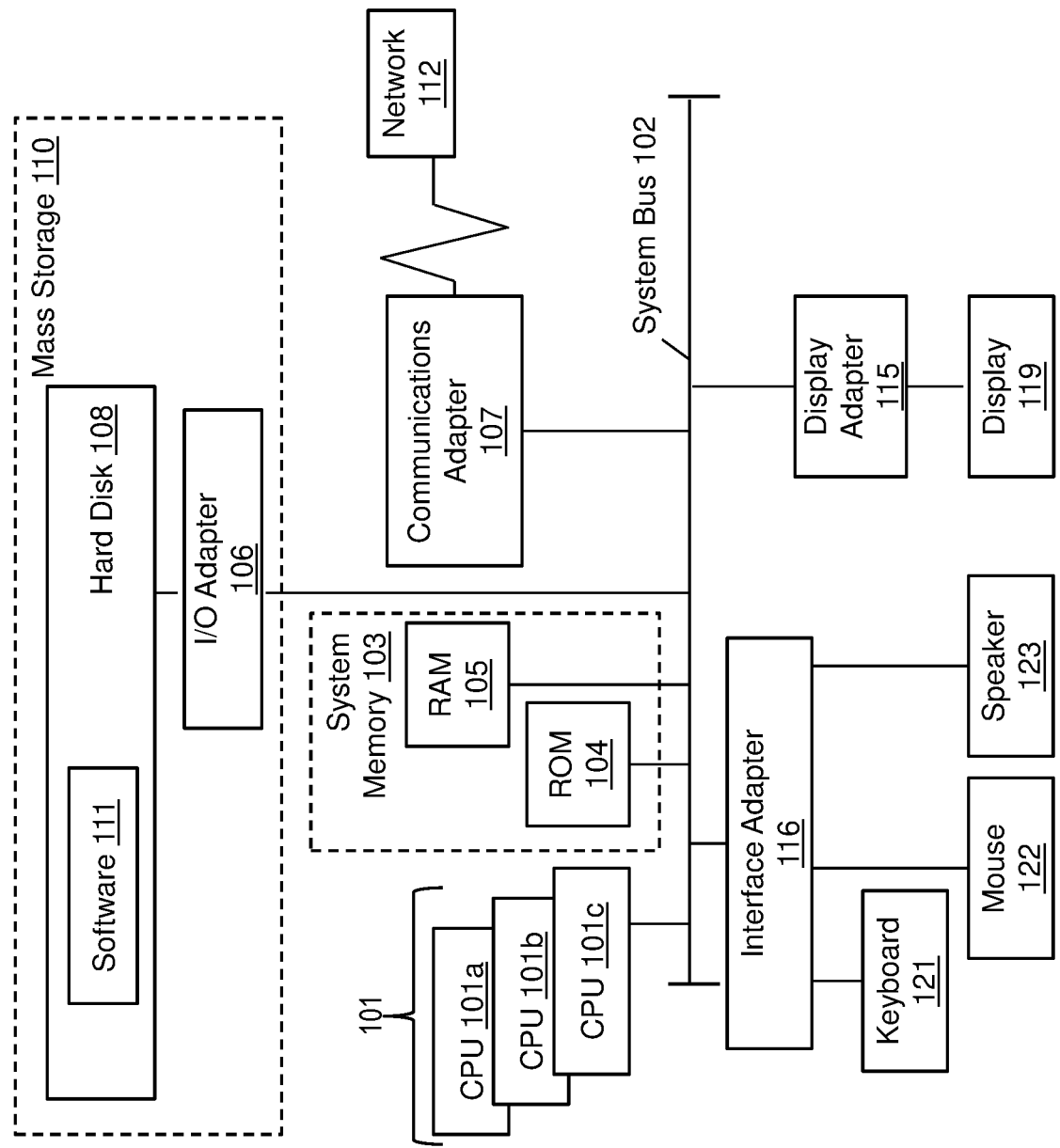
FIG. 1 depicts a block diagram of an example computer system for use in conjunction with one or more embodiments of the present invention.

One or more embodiments of the invention are configured to convert formal verification drivers with nondeterministic inputs to simulation monitors with a deterministic input. Systems and methods are configured to soundly translate formal testbench drivers with random bit inputs to simulation-capable monitors. The testbench allows a user to verify the functionality of a design or design under test (DUT) through exhaustive state-space exploration. It is a container where the design is placed and driven with different input stimulus. In general, the testbench is able to generate different types of input stimulus, drive the design inputs with the generated stimulus, allow the design to process input and provide an output, check the output with expected behavior to find functional defects, if a functional bug is found, then change the design to fix the bug, and repeat the above processes until there are no more functional defects.

Formal verification of register-transfer level (RTL) hardware designs using standard automatic model checking tools involves writing a formal testbench to surround a design-under-test (DUT) like a device-under-test. In digital circuit design, RTL is a design abstraction which models a synchronous digital circuit in terms of the flow of digital signals (data) between hardware registers and the logical operations performed on those signals. A testbench consists of a "driver" which is a sequential circuit used to stimulate the design with legal inputs sequences, and a "checker" which is a sequential circuit that depends on input and output sequences and flags functional errors. Formal drivers often require substantial effort to develop and maintain and often encode the best understood specification of a block of logic with interfaces internal to a unit. For tractability/manageability of both formal tools and driver coding, the permitted sequences are intended to overapproximate the expected set of real infinite length input valuation sequences. That is, if an abstraction of the driving logic can be written simply and is guaranteed to include the set of real traces, then any unreachable fail state with this driver will likewise be unreachable with expected traces.

It is therefore desirable if the formal driver can be leveraged as a monitor for simulation and reporting a failure when the simulation sequence is not permitted by and/or would not have been permitted by the formal driver. Such failures could indicate bugs in either the formal driver, meaning the formal driver does not cover the expected traces, or in the upstream logic from the DUT, meaning the unexpected sequence was caused by implementation errors in other logic or that simulation is driving an invalid sequence. Investigating these failures can reveal otherwise hard to catch "underdriving" in the formal environment, or if the problem lies in upstream logic, the simulation will terminate earlier at a point closer to the root cause, easing the trouble shooting effort. This "driver-to-monitor" translation and use greatly improves the return on investment (ROI) of the effort to write and maintain a formal driver.

Figure 3:
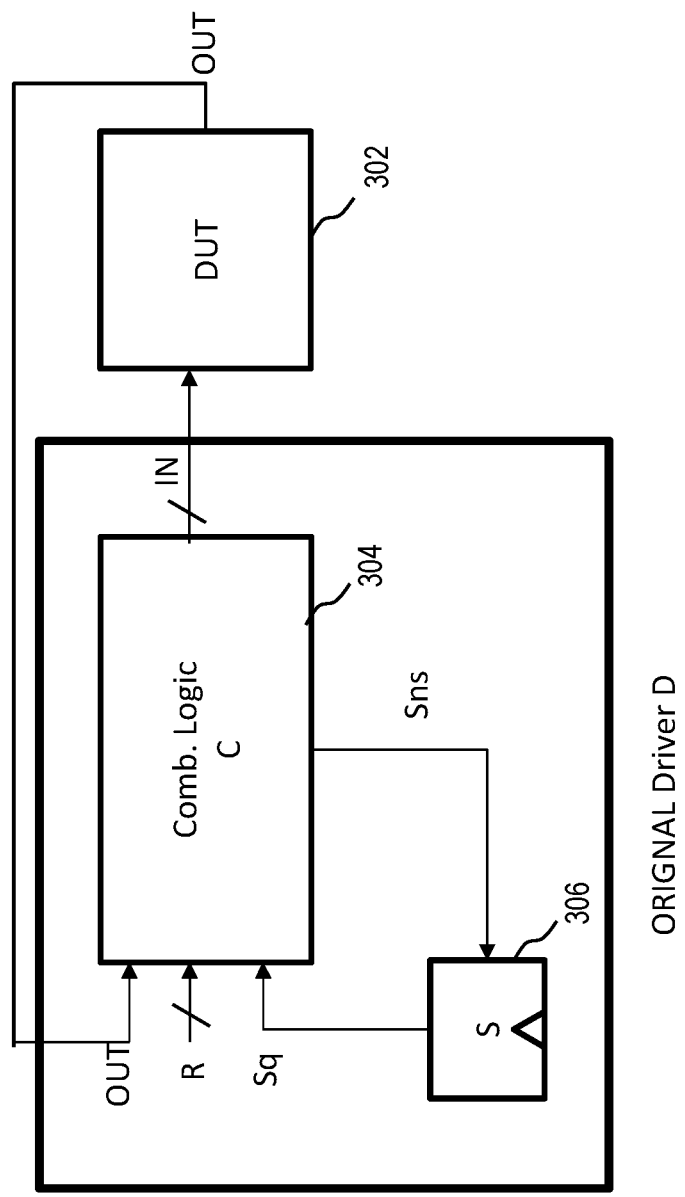
FIG. 3 depicts a block diagram of an example random input formal driver in accordance with one or more embodiments of the present invention.

One method of writing a driver is "constraint-based" in which the driver has sequential state that determines legal input valuations by a set of constraints relating the state and input bits; the next state depends on the current state, the inputs just driven, and the DUT outputs. Another method of writing a driver uses explicit "random bit" inputs as depicted in FIG. 3. These are driver input signals (R) that are nondeterministic and are evaluated as both 0 and 1 in each timestep. Having a driver using random bit inputs more closely matches sequential circuit design and is typically more intuitive to the verification engineer, thereby easing debug trace analysis as the nondeterminism appears explicitly. A fundamental drawback of this "random bit" approach is that it is not straightforward to translate the driver into a monitor appropriate for simulation. Contrast this with the constraint-based driver, where the sequential driver logic may be attached to a simulation environment by driving Combinational Logic N with input IN valuations from the simulation logic and flagging an error if any constraints are violated. With the random bit approach, one might check if the simulation's valuation for input IN matches the driver's input. However, in a simulation environment, the nondeterministic inputs R are driven by a random choice, and if the wrong choice for R is made in the current timestep, the input IN comparison will mismatch, when possibly a different choice for R would match the simulation's inputs, which is one problem (#1). Even more vexing, the wrong choice for R could have occurred earlier in time, resulting in an unavoidable future mismatch, which is the second problem (#2). One or more embodiments of the invention provide techniques for testing if the second problem (#2) is possible, and if confirmed to be impossible, generate a formal driver-based monitor where the first problem (#1) cannot occur.

In principle, these problems (#1 and #2) relate to the well-known nondeterministic finite automata (NFA) to deterministic finite automata (DFA) construction. However, there are significant implementation hurdles to contend with how to represent the DFA state. If the original driver has N bits of state, then in the worst case there are most $2^N$ driver state (DS) configurations reachable from the initial state. The NFA to DFA transformation results in a DFA where each state represents each subset of DS; in the worst case, there are $2^{(2^N)}$ such states, which requires $2^N$ state bits to represent. This exponential blowup can easily render the monitor unusable in a practical simulation environment. One or more embodiments of the invention are configured to avoid this situation and makes this unnecessary, where drivers are written with the intent that the next-state is unique, given the current-state and DUT IN/OUT valuations.

Turning now to FIG. 1, a computer system 100 is generally shown in accordance with one or more embodiments of the invention. The computer system 100 can be an electronic, computer framework comprising and/or employing any number and combination of computing devices and networks utilizing various communication technologies, as described herein. The computer system 100 can be easily scalable, extensible, and modular, with the ability to change to different services or reconfigure some features independently of others. The computer system 100 may be, for example, a server, desktop computer, laptop computer, tablet computer, or smartphone. In some examples, computer system 100 may be a cloud computing node. Computer system 100 may be described in the general context of computer system executable instructions, such as program modules, being executed by a computer system. Generally, program modules may include routines, programs, objects, components, logic, data structures, and so on that perform particular tasks or implement particular abstract data types. Computer system 100 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, the computer system 100 has one or more central processing units (CPU(s)) 101a, 101b, 101c, etc., (collectively or generically referred to as processor(s) 101). The processors 101 can be a single-core processor, multi-core processor, computing cluster, or any number of other configurations. The processors 101, also referred to as processing circuits, are coupled via a system bus 102 to a system memory 103 and various other components. The system memory 103 can include a read only memory (ROM) 104 and a random access memory (RAM) 105. The ROM 104 is coupled to the system bus 102 and may include a basic input/output system (BIOS) or its successors like Unified Extensible Firmware Interface (UEFI), which controls certain basic functions of the computer system 100. The RAM is read-write memory coupled to the system bus 102 for use by the processors 101. The system memory 103 provides temporary memory space for operations of said instructions during operation. The system memory 103 can include random access memory (RAM), read only memory, flash memory, or any other suitable memory systems.

The computer system 100 comprises an input/output (I/O) adapter 106 and a communications adapter 107 coupled to the system bus 102. The I/O adapter 106 may be a small computer system interface (SCSI) adapter that communicates with a hard disk 108 and/or any other similar component. The I/O adapter 106 and the hard disk 108 are collectively referred to herein as a mass storage 110.

Software 111 for execution on the computer system 100 may be stored in the mass storage 110. The mass storage 110 is an example of a tangible storage medium readable by the processors 101, where the software 111 is stored as instructions for execution by the processors 101 to cause the computer system 100 to operate, such as is described herein below with respect to the various Figures. Examples of computer program product and the execution of such instruction is discussed herein in more detail. The communications adapter 107 interconnects the system bus 102 with a network 112, which may be an outside network, enabling the computer system 100 to communicate with other such systems. In one embodiment, a portion of the system memory 103 and the mass storage 110 collectively store an operating system, which may be any appropriate operating system to coordinate the functions of the various components shown in FIG. 1.

Additional input/output devices are shown as connected to the system bus 102 via a display adapter 115 and an interface adapter 116. In one embodiment, the adapters 106, 107, 115, and 116 may be connected to one or more I/O buses that are connected to the system bus 102 via an intermediate bus bridge (not shown). A display 119 (e.g., a screen or a display monitor) is connected to the system bus 102 by the display adapter 115, which may include a graphics controller to improve the performance of graphics intensive applications and a video controller. A keyboard 121, a mouse 122, a speaker 123, etc., can be interconnected to the system bus 102 via the interface adapter 116, which may include, for example, a Super I/O chip integrating multiple device adapters into a single integrated circuit. Suitable I/O buses for connecting peripheral devices such as hard disk controllers, network adapters, and graphics adapters typically include common protocols, such as the Peripheral Component Interconnect (PCI) and the Peripheral Component Interconnect Express (PCIe). Thus, as configured in FIG. 1, the computer system 100 includes processing capability in the form of the processors 101, and, storage capability including the system memory 103 and the mass storage 110, input means such as the keyboard 121 and the mouse 122, and output capability including the speaker 123 and the display 119.

In some embodiments, the communications adapter 107 can transmit data using any suitable interface or protocol, such as the internet small computer system interface, among others. The network 112 may be a cellular network, a radio network, a wide area network (WAN), a local area network (LAN), or the Internet, among others. An external computing device may connect to the computer system 100 through the network 112. In some examples, an external computing device may be an external webserver or a cloud computing node.

It is to be understood that the block diagram of FIG. 1 is not intended to indicate that the computer system 100 is to include all of the components shown in FIG. 1. Rather, the computer system 100 can include any appropriate fewer or additional components not illustrated in FIG. 1 (e.g., additional memory components, embedded controllers, modules, additional network interfaces, etc.). Further, the embodiments described herein with respect to computer system 100 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Figure 2:
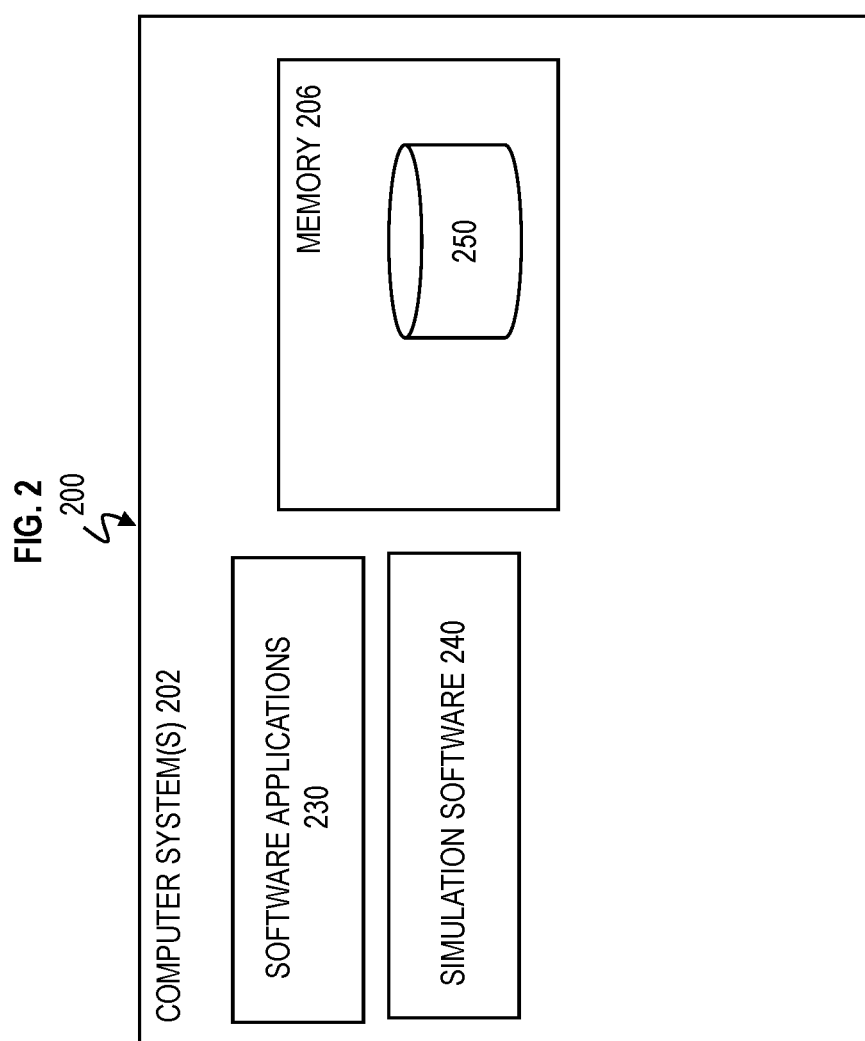
FIG. 2 is a block diagram of a system for converting a formal verification driver with nondeterministic inputs to a simulation monitor for use with a simulation environment for checking a design-under-test (DUT) in accordance with one or more embodiments of the present invention.

FIG. 2 is a block diagram of a system 200 for converting formal verification drivers with nondeterministic inputs to simulation monitors for use with a simulation environment for checking a design under test (DUT) in accordance with one or more embodiments of the present invention. FIG. 2 depicts one or more computers systems 202. Elements of computer system 100 may be used in and/or integrated into computer system 202. One or more software applications 230 and simulation software applications 240 can utilize and/or be implemented as software 111 executed on one or more processors 101, as discussed in FIG. 1. Software applications 230 may include, be integrated with, and/or employ various types software including but not limited to hardware description languages (HDLs) like SystemVerilog and VHDL to create high-level representations of a circuit, from which lower-level representations and ultimately actual wiring can be derived. HDL is a specialized computer language used to describe the structure and behavior of electronic circuits, and most commonly, digital logic circuits. A hardware description language enables a precise, formal description of an electronic circuit that allows for the automated analysis and simulation of an electronic circuit.

For explanation purposes and ease of understanding, an example scenario is provided as depicted in FIG. 3. FIG. 3 depicts a random input formal driver D according to one or more embodiments of the invention. The example scenario takes as given a sequential circuit that implements a formal verification driver D with sequential state S, with sets of Boolean signals in FIG. 3. A design under test (DUT) 302 is coupled to driver D. In FIG. 3, R represents "random" or non-deterministic inputs to driver D, where IN represents inputs to a DUT (design-under-test) driven by driver D, where OUT represents outputs from the DUT, where Sns represents the "next state" of S, and where Sq represents the "current state" of S. Driver D includes combination logic (C) 304 coupled in a feedback to state memory element (S) 306. Combination logic includes various logic gates connected together to receive inputs and provide an output. Sequential logic (or sequential circuits) is a type of logic circuit whose output depends not only on the present value of its input signals but on the sequence of past inputs, along with the input history. This is in contrast to combinational logic, whose output is a function of only the present input. That is, sequential logic has state (memory) while combinational logic does not. Memory element 'S' may include latches, flip flops, etc., to receive the next state (Sns) of "S" and provide the current state (Sq) of "S".

In FIG. 3, one or more embodiments are configured to utilize software applications 230 to check if the input (IN) from driver D to DUT 302 can be leveraged as a monitor for simulation, without increasing the number of Boolean state variables beyond |S| which are the number of bits used to represent the state as explained further below. Particularly, this check is the difference in how input random sequence R is treated semantically in a formal environment versus a simulation environment. A formal environment will simultaneously consider both 0 and 1 valuations for each individual bit "r" in random bits R, where as a simulation environment considers only one valuation according to a weighted random choice. Therefore, it is instructive to consider such signals as "nondeterministic" in a formal verification context and "random" in a simulation context. Moreover, the random input formal verification driver D characterizes and/or generates a set of sequential inputs "IN" (which are nondeterministic) for use by the DUT.

Figure 9:
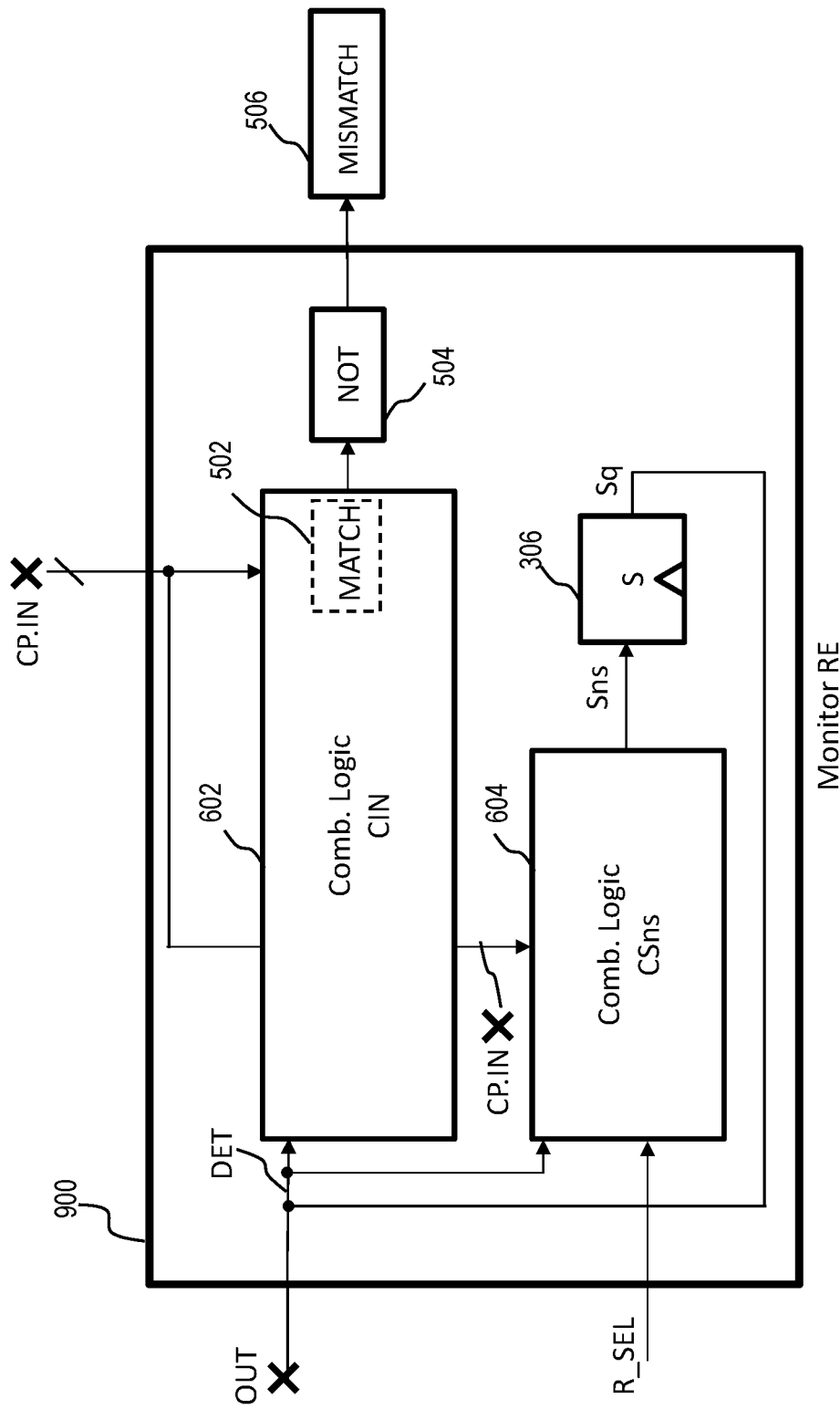
FIG. 9 depicts a block diagram to check for adherence of a simulation generated input sequence to the input sequences allowed by the monitor in accordance with one or more embodiments of the present invention.
Figure 10:
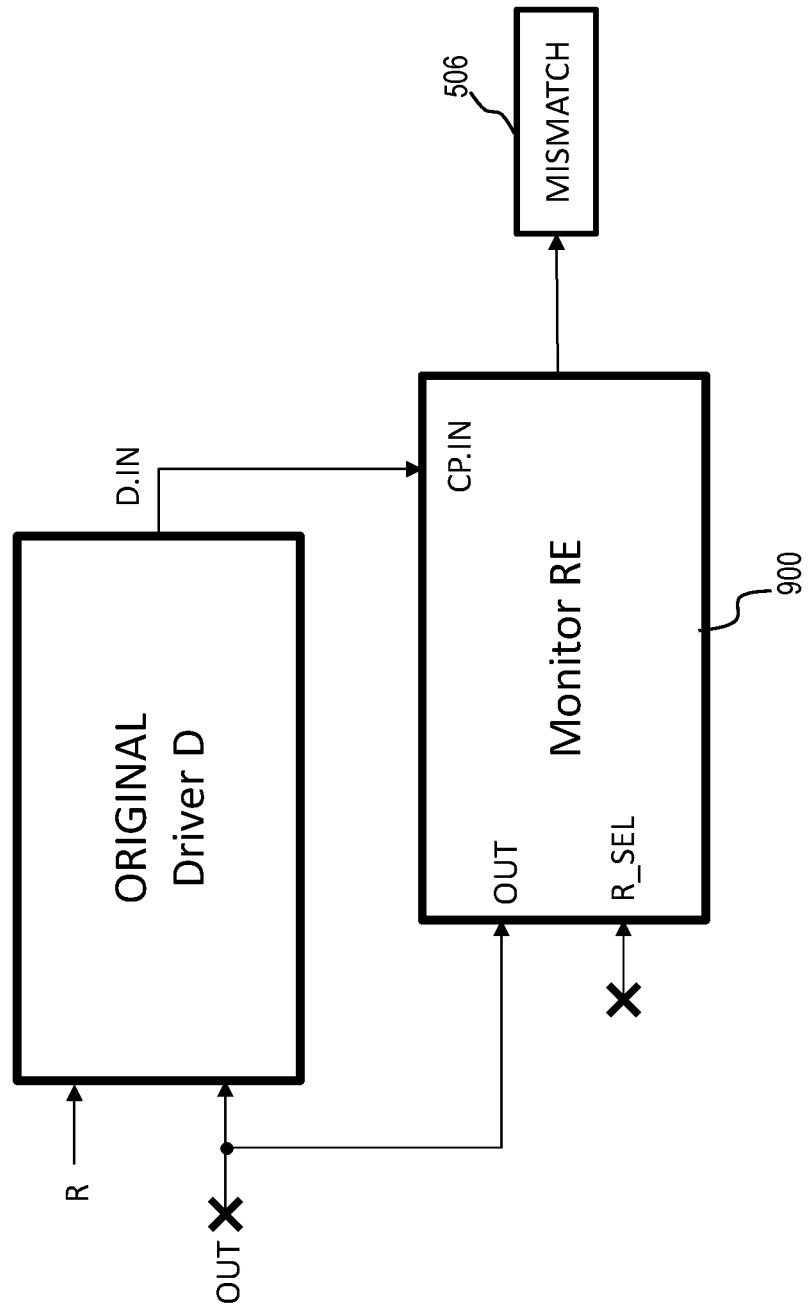
FIG. 10 depicts a block diagram to check interface sequence matching between a monitor and a formal driver in accordance with one or more embodiments of the present invention.

FIGS. 4, 5, 6, 7, and 8 illustrate processes to construct a random bit eliminated (RE) monitor (depicted as monitor RE 900 in FIG. 9) according to one or more embodiments of the invention. FIG. 9 illustrates a check for generality of monitor RE 900 to match an internally generated sequence (IN) to an input sequence of random bits utilized at a comparative input (e.g., designated as CP.IN) according to one or more embodiments of the invention. FIG. 10 illustrates use of the monitor RE 900 as a simulation monitor according to one or more embodiments of the invention.

Figure 4:
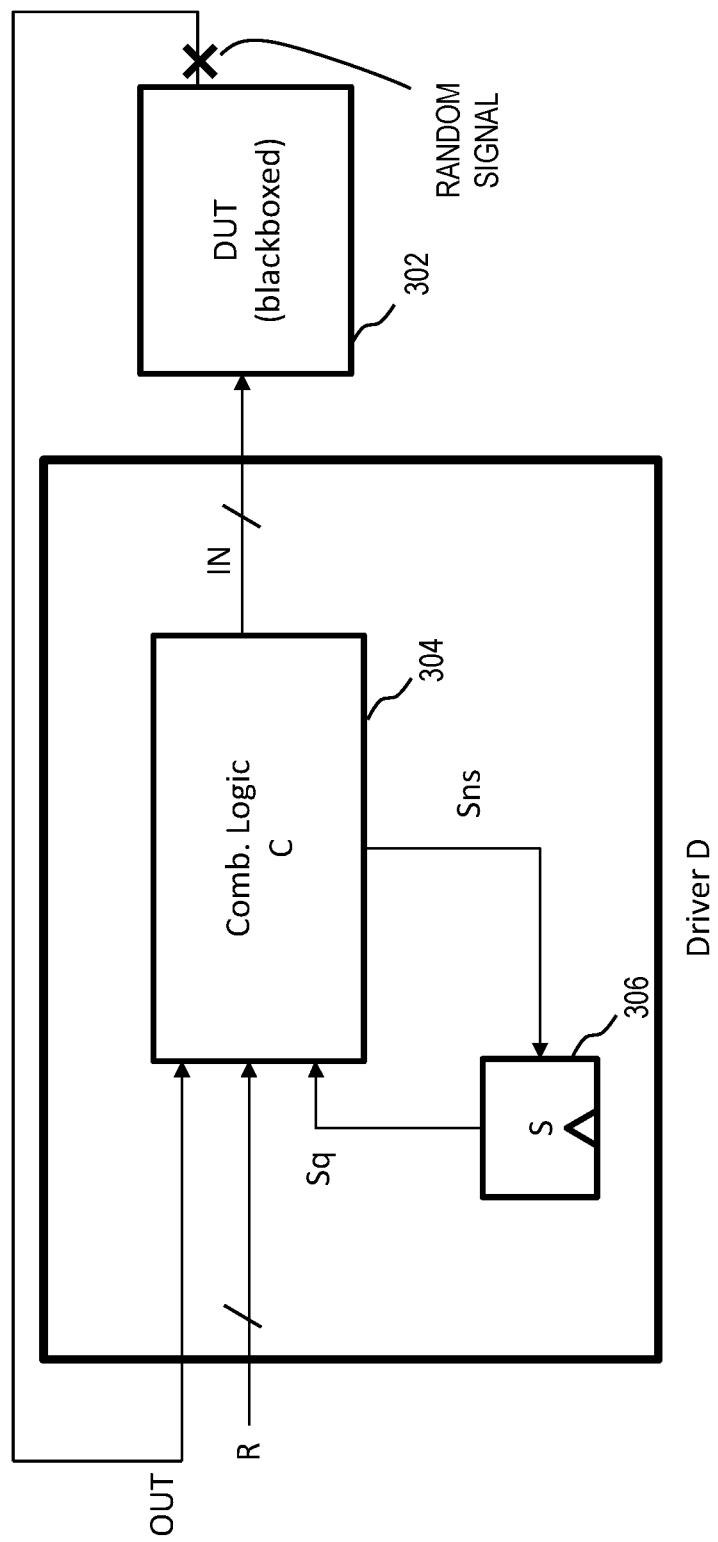
FIG. 4 depicts a block diagram of black boxing the DUT in accordance with one or more embodiments of the present invention.
Figure 5:
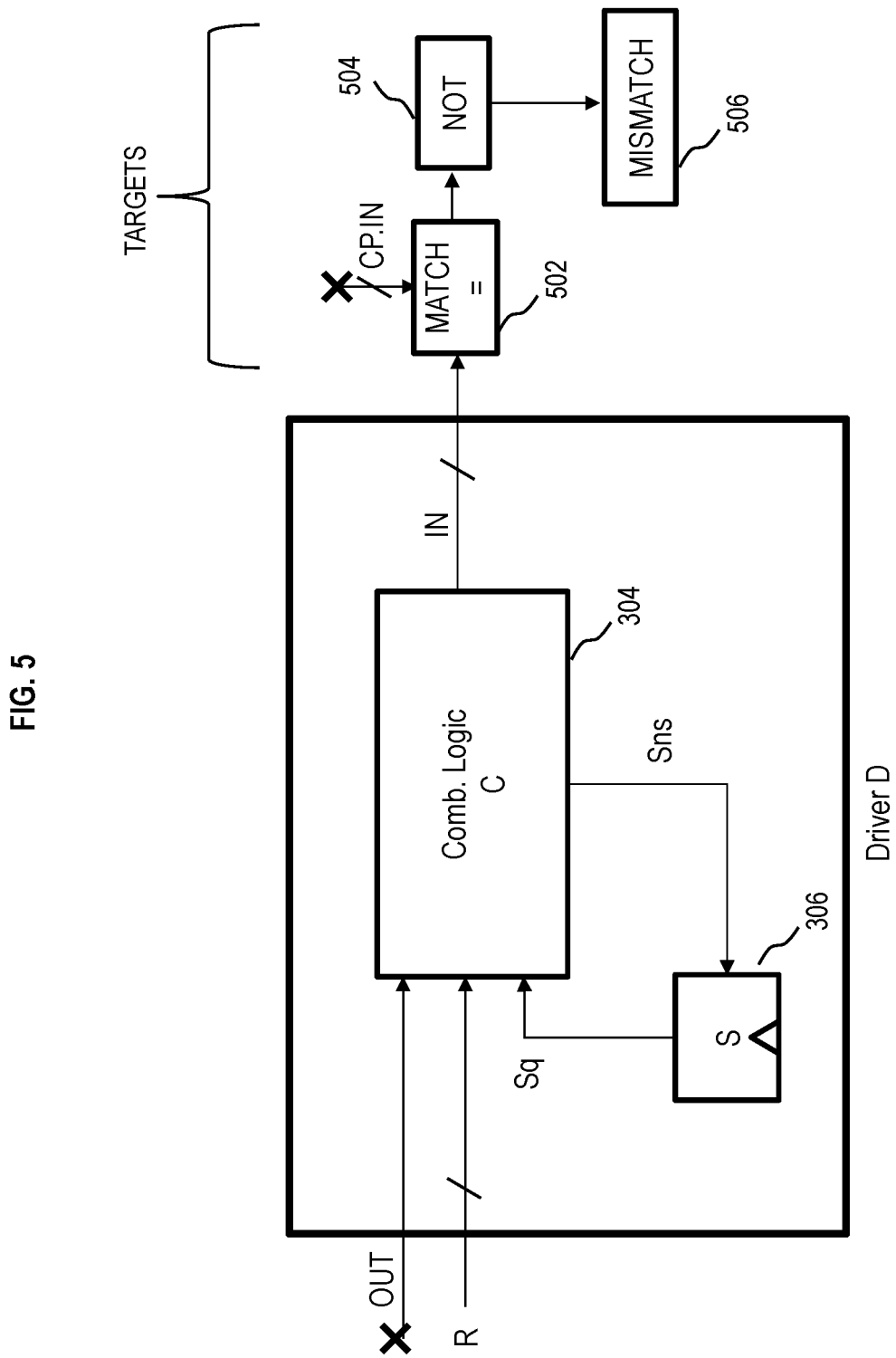
FIG. 5 depicts a block diagram of a bitwise equality check between new comparison inputs (CP.IN) and driver produced inputs (IN) in accordance with one or more embodiments of the present invention.

Turning now to FIG. 4, a block diagram of DUT black boxing is depicted in accordance with one or more embodiments of the invention. While formal drivers are usually written to interact with a specific DUT, this logic is not necessary for construction and evaluation of a random eliminated (RE) monitor or monitor RE 900 being built (and tested as described in FIGS. 5-10) according to one or more embodiments. In FIG. 4, software applications 230 are configured to "blackbox" the DUT 302. Black boxing DUT 302 includes driving OUT as random bits or a random input, as denoted by "X", and disconnecting the driver signals to DUT inputs IN as depicted in FIG. 5. Particularly, "X" is used herein to denote randomly driven signals in FIG. 4 and other figures, and "X" could be representative of replacing the regular signal with a random signal generator. Accordingly, the output OUT of DUT 302 is replaced with random bits denoted by "X", thereby making DUT 302 operate as a black box that outputs a random signal for OUT regardless of the input IN. Although "X" is used in figures to represent randomly driven signals which can be a random bit sequence, "X" is not meant to denote that the random signal carries the same value as other signals marked with "X".

FIG. 5 depicts a block diagram of DUT black boxing with targets replacing DUT 302 in accordance with one or more embodiments of the invention. Formal driver D has a set of output signals IN to drive as inputs to DUT 302 at each timestep. Software applications 230 are configured to create a copy of the set of signals IN which are named CP.IN, and signals CP.IN are undriven for now but will be connected to a simulation environment (depicted as DUT driving logic 1104 in FIG. 11) that is to be monitored. Again, the "X" denotes randomly driven signals in FIG. 5, and as such, both OUT and CP.IN are represented by randomly driven signals. Software applications 230 are configured to create a target signal MATCH<=FORALL x in IN: IN.x=CP.IN.x, which means that all bits x in the input IN are compared to all bits x in CP.IN. Software applications 230 are configured to create a target signal MISMATCH<=NOT MATCH, when there is not match between signal IN and signal CP.IN. These signals capture if the monitor (being created) can match the input valuations generated from the compared driving of CP.IN and IN, in which CP.IN is compared to IN from driver D. When replacing DUT 302 in FIG. 5, match 502 receives signal IN from combination logic C 304 and signal CP.IN, where match 502 compares the two received signals. Signal IN and signal CP.IN have the same bit length/bit width, such as, for example, 100 bits which is indicated forward slash "/". Match 502 includes logic gates and functions as a comparator. Match 502 compares each respective bit position in signal IN to signal CP.IN to check that each value (e.g., 0 or 1) is the same for respective bit positions, for example, by performing a pairwise comparison. If signal IN matches signal CP.IN, match 502 is configured to output a "1" for true (i.e., match) and output a "0" for false (i.e., no match). Not 504 includes logic gates (e.g., NOT gate) configured to flip the output/value from match 502, and mismatch 506 includes logic to check and capture signal IN and signal CP.IN when there is a match. The captured signals may be stored in database 250 of memory 206. When Not 504 produces a "1", mismatch 506 determines there is a mismatch, and when Not 504 produces a "0", there is no mismatch.

Figure 6A:
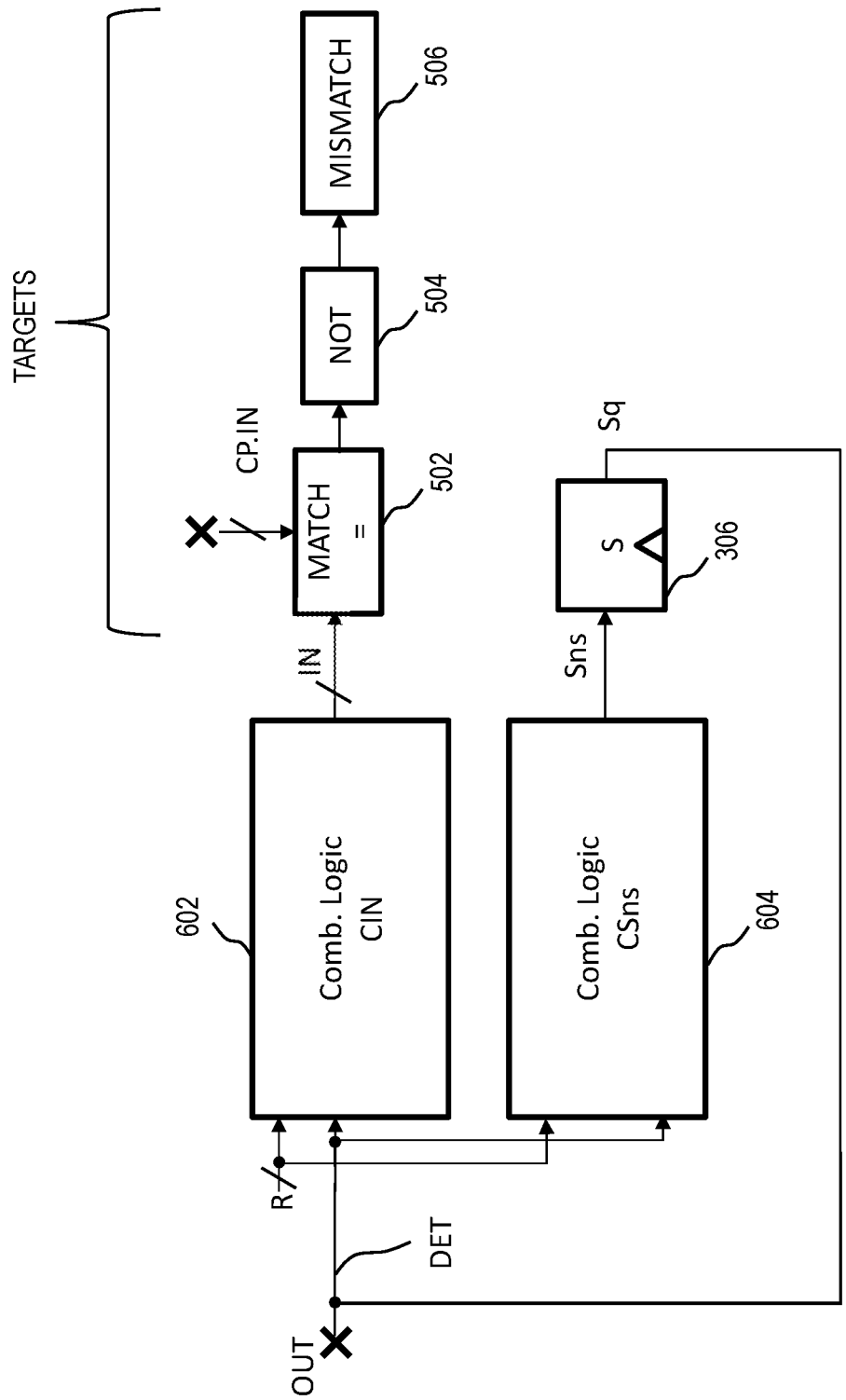
FIG. 6A depicts a block diagram of factoring the combinational logic (or factored driver) in accordance with one or more embodiments of the present invention.
Figure 6B:
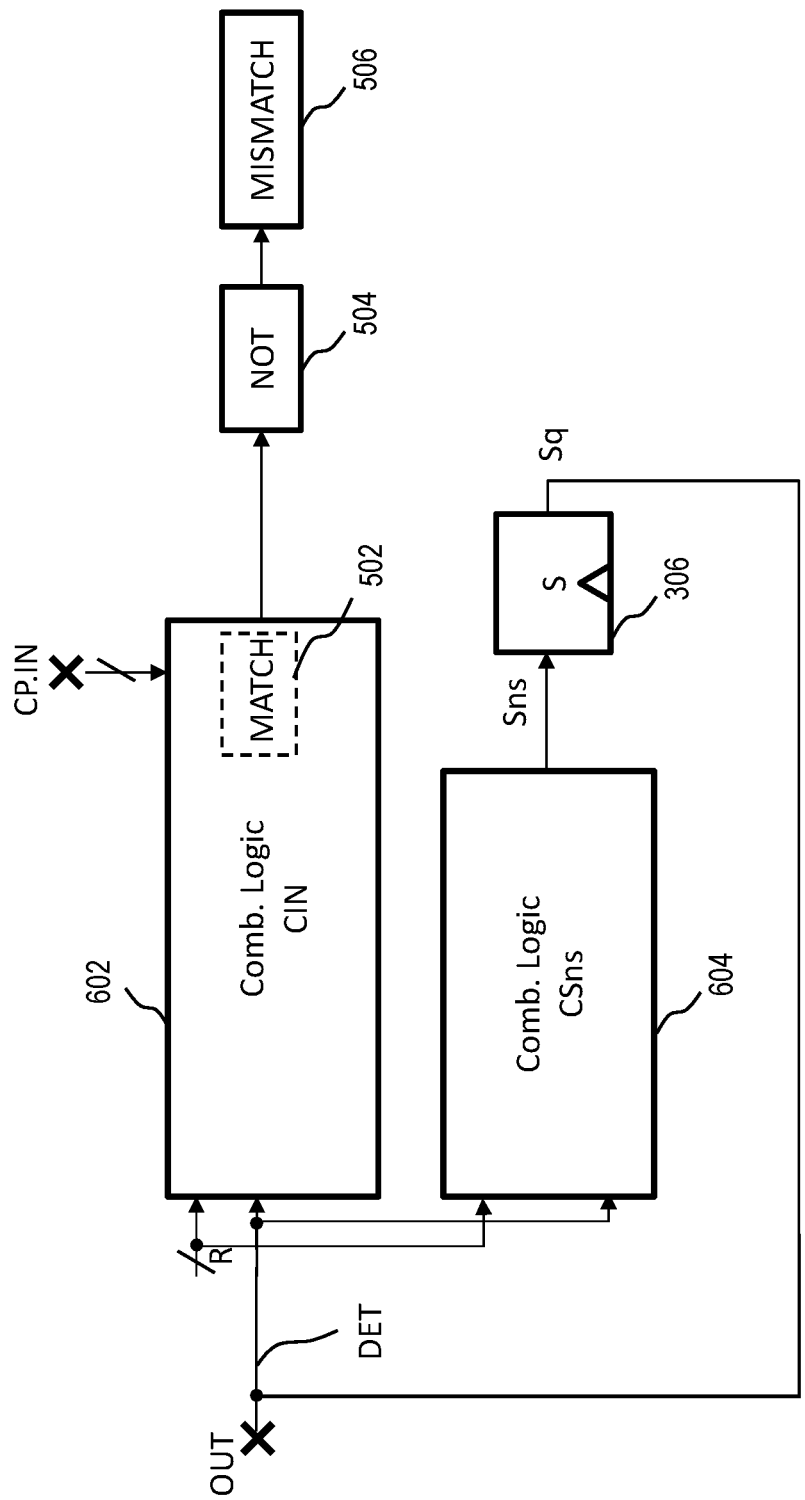
FIG. 6B depicts a block diagram of factoring the combinational logic (or factored driver) for subsequent iterations in accordance with one or more embodiments of the present invention.

FIG. 6A depicts a block diagram of factoring the combinational logic C 304 (or factored driver) for an initial iteration in accordance with one or more embodiments of the invention, when building monitor RE 900. Software applications 230 are configured to duplicate combinational logic C 304 having inputs Sq, OUT, R and outputs IN, Sns and split combinational logic of combinational logic C as combinational logic CIN 602 and combinational logic CSns 604. Accordingly, combinational logic CIN 602 now has output IN and combinational logic CSns has output Sns. Combinational logic CIN 602 and combinational logic CSns 604 have no common fan-in, other than inputs. In FIG. 6A, both combinational logic CIN 602 and combinational logic CSns 604 receive inputs R and DET, where DET is the union of signal sets OUT and Sq. Combinational logic CIN 602 and combinational logic CSns includes logic gates such as AND, OR, NAND, NOR or NOT gates that are combined or connected together to produce more complicated switching circuits. These logic gates are the building blocks of combinational logic circuits. The result is that combinational logic circuits have no feedback, and any changes to the signals being applied to their inputs will immediately have an effect at the output. In other words, in a combinational logic circuit, the output is dependent at all times on the combination of its inputs. Thus, a combinational circuit is memoryless. Unlike sequential logic circuits whose outputs are dependent on both their present inputs and their previous output state giving them some form of memory. The outputs of combinational logic circuits are only determined by the logical function of their current input state, logic "0" or logic "1", at any given timestep. FIG. 6B depicts a block diagram of factoring the combinational logic C 304 (or factored driver) over subsequent iterations to eliminate "r" as discussed further in accordance with one or more embodiments of the invention, when building monitor RE 900. FIG. 6B is analogous to FIG. 6A, except match logic, similar to match 502 but applicable to matches corresponding to all valuations of all random inputs eliminated to this point, is now internal to combinational logic CIN 602. Accordingly, signal IN is internal to combinational logic CIN 602 and is internally compared to signal CP.IN, such that combinational logic CIN 602 (via match 502) outputs a "1" for true (i.e., match) and a "0" for false (i.e., no match). As will be discussed further herein, match 502 is redefined each time an "r" is eliminated, as discussed in FIGS. 7A and 7B below.

Figure 7A:
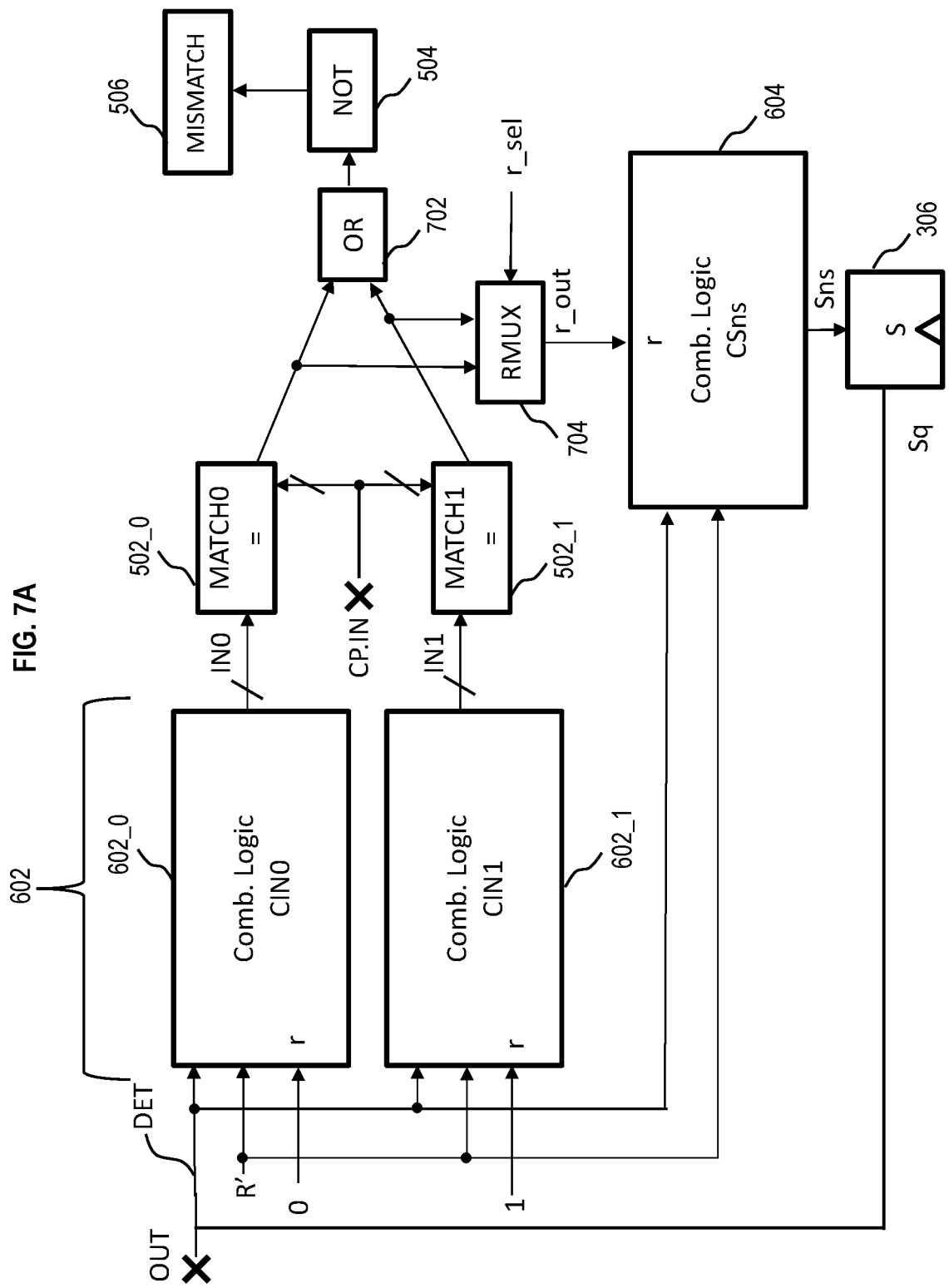
FIG. 7A depicts a block diagram of eliminating a random bit from a set of random bits which are received as input for monitoring in accordance with one or more embodiments of the present invention.
Figure 7B:
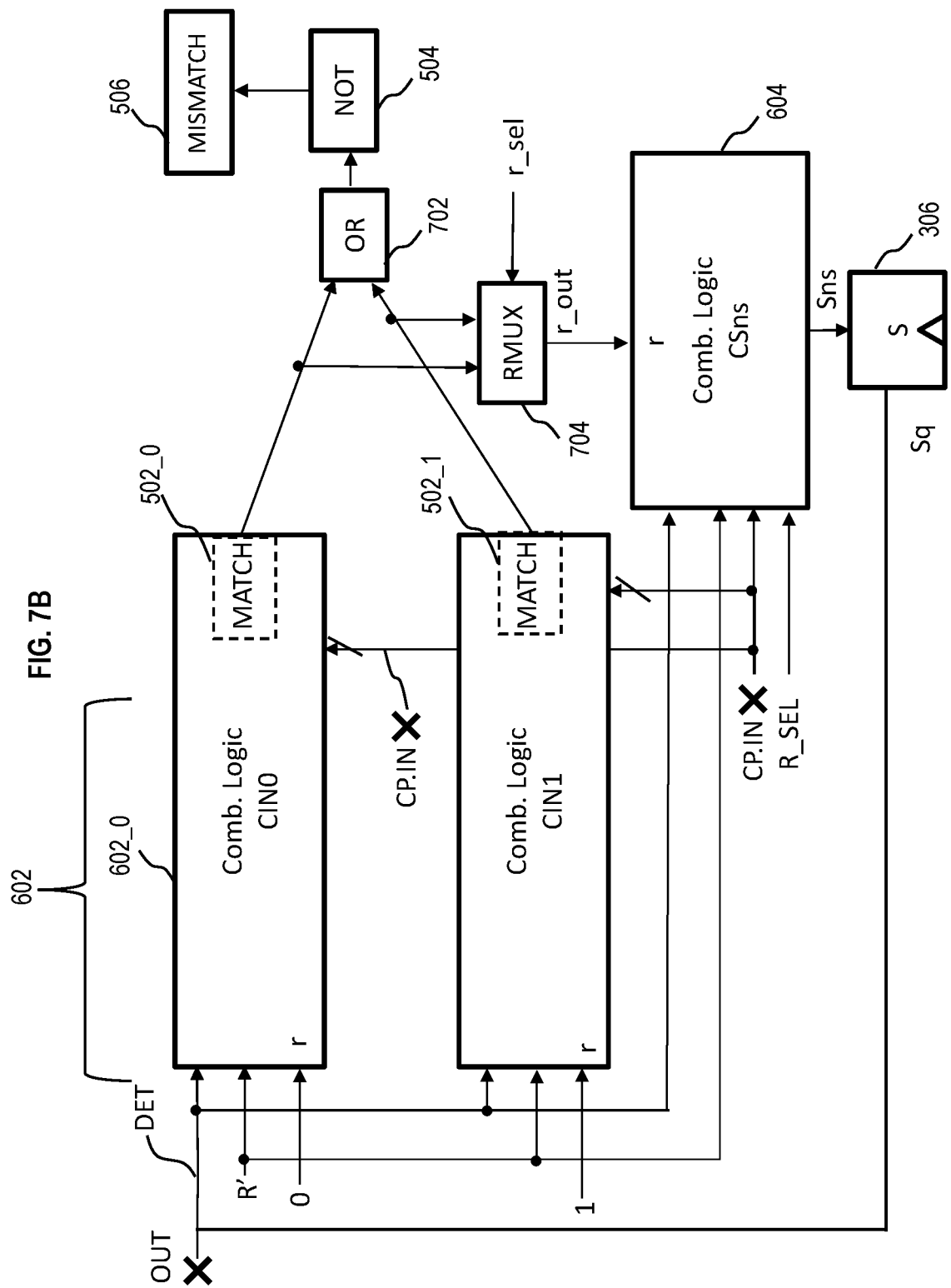
FIG. 7B depicts a block diagram of eliminating a random bit from a set of random bits which are received as input for monitoring for subsequent iterations in accordance with one or more embodiments of the present invention.

FIG. 7A depicts a block diagram of eliminating a random bit "r" from a set of random bits "R" for an initial iteration in accordance with one or more embodiments of the invention. FIG. 7B depicts a block diagram of eliminating a random bit "r" from a set of random bits "R" for subsequent iterations in accordance with one or more embodiments of the invention. The random bit "r" can be located at any random bit position in the sequence of random bits "R". FIGS. 7A and 7B depict how to eliminate the random bit r. Eliminating the random bit means to provide a deterministic value for "r" instead of a random value, and this process is repeated for all the bits in the sequence of random bits "R". FIG. 7A depicts combinational logic CIN0 602_0 and combinational logic CIN1 602_1 which are duplicates of combinational logic CIN 602. In FIG. 7A, the random bit "r" is given a deterministic input or fixed value to combinational logic CIN0 602_0 and a different deterministic input or fixed value to combinational logic CIN1 602_1. As noted herein, "X" indicates randomly driven signals. Software applications 230 are configured to use the initial assignment R':=R, and subsequent assignment R':=R'-{r}, where "r" is a random bit, for example, a random bit position in the random bits R, where r_sel is a new random input. This process in to eliminate the nondeterministic values in R. As such, software applications 230 are configured to iterate over removal of r from R, with initial assignment R':=R and then by assignment R':=R'-{r} and prior to the next iteration until each bit of R is replaced and/or replaceable with a fixed value (e.g., 0 or 1). Similarly, R_SEL refers to the set of inputs r_sel for those r eliminated so far. After the first elimination of "r", R_SEL:={r_sel}, and with subsequent eliminations R_SEL:=R_SEL UNION {r_sel}. Random bits are continuously eliminated for "r" until all bit positions in random bits R have been selected for replacement.

MATCH0 502_0 and MATCH1 502_1 are duplicates of MATCH 502, where MATCH0 502_0 receives signal IN0 from combinational logic CIN0 602_0 and MATCH1 502_1 receives signal IN1 from combinational logic CIN1 602_1 for comparison against signal CP.IN in FIG. 7A. As an example, CP.IN is specified as undriven using "X". The interpretation of the X symbol is not limiting when describing the "MATCH" block. Wires marked with "X" are 'undriven', and in a formal verification context usually are interpreted to be allowed to take any value during any timestep, which can be referred to as "random". The match block (including MATCH0 502_0 and MATCH1 502_1) is designed to compare its two bit vectors of (say) n+1 bits each, where the two bit vectors can be called A(0:n) and B(0:n), and where the single bit output of the match block is 1 if A(i)=B(i) for each i. In other words, (A(0)=B(0)) and (A(1)=B(1)) and . . . and (A(n)=B(n)). Additionally, OR 702 is connected to MATCH0 502_0 and MATCH1 502_1. OR 702 includes logic for an OR gate. OR 702 is connected to NOT 504 which is connected to MISMATCH 506. When there is no mismatch received at MISMATCH 506 (i.e., when "0" is received by mismatch 506), the result is a single random input elimination which means that "r" (or the randomness of "r") is eliminated and/or fixed for its associated bit position in the sequence of random bits R, and the process continues for other bit position of r. The value of "r", which is either a 0 or 1 input to combinational logic CIN0 and combinational logic CIN1 respectively, that caused a match at MATCH0 502_0 or MATCH1 502_1 is determined by RMUX 704, and the value of "r" can be saved in state memory element 306 (e.g., of memory 206) according to the determination made by RMUX 704 for the respective bit position. Further details regarding RMUX 704 are discussed below. FIG. 7B used after the initial iteration is analogous to FIG. 7A, except MATCH0 502_0 is now internal to combinational logic CIN 602_0, and MATCH0 502_1 is now internal to combinational logic CIN 602_1. Accordingly, combinational logic CIN 602_0 (via MATCH0 502_0) outputs a "1" for true (i.e., match) and a "0" for false (i.e., no match). Similarly, combinational logic CIN 602_1 (via MATCH0 502_1) outputs a "1" for true (i.e., match) and a "0" for false (i.e., no match).

According to one or more embodiments, software applications 230 are configured to leverage a well-known quantifier elimination on Boolean formulas. Quantifier elimination is a concept of simplification used in mathematical logic, model theory, and theoretical computer science. Given a Boolean formula f(x1,x2, . . . ,xn) where x1, . . . ,xn are free variables and f: B"->B, the quantified expression:

EXISTS x1. f(x1, x2, . . . , xn);

Is true if and only if f(0,x2, . . . ,xn) OR f(1,x2, . . . ,xn).

This elimination approach may be applied to combinational logic with random inputs, where B denotes Boolean (i.e., value 0 or 1), where "n" represents a bit string (e.g., n inputs) and each value of "n" corresponds to a bit position in the input sequence of "R". Similar to quantifier elimination of Boolean formulas, software applications 230 exploit the fact that each output y of C is a Boolean function of R and DET. A further example of quantifier elimination for a Boolean function is given below, which can also assist the reader with understanding the transformation from FIG. 5 to FIG. 6A. Any combinational logic C with n+1 inputs, x0, xn, can have each output y expressed as a Boolean function, y(x0, . . . , xn). The quantifier elimination is pointing out that y(x0, . . . , xn) is equal to y(0, x1, . . . , xn) OR y(1, x1, . . . , xn).

For some "r" in "R", software applications 230 are configured to eliminate "r" from combinational logic CIN by duplicating combinational logic CIN as combinational logic CIN0 and combinational logic CIN1 where combinational logic CIN0 and combinational logic CIN1 are driven identically, but for "r" which is a constant 0 in combinational logic CIN0 and a constant 1 in combinational logic CIN1. The MATCH output is named MATCH0 for combinational logic CIN0, and MATCH1 for combinational logic CIN1, and the MATCH target is assigned as MATCH<=MATCH0 OR MATCH1.

The previous operation effectively removes "r" from the combinational logic (combinational logic CIN0 and CIN1) related to MATCH, but "r" (which is designated as output r_out from RMUX 704) remains an input to combinational logic CSns 604. To remove r_out which is effectively the same value as "r" from this logic of RMUX 704 as well, RMUX 704 is configured to select a valuation/value of "r" that resulted in a match to drive r in combinational logic CSns 604. RMUX 704 is combinational logic cell that includes functionality of a multiplexor with 3 inputs namely an input from MATCH0, an input from MATCH1, and a new random input r_sel. Also, RMUX 704 includes 1 output designed r_out, along with logic to select a value for "r" to be output on r_out based on MATCH0, MATCH1, and an RMUX logic table 800 (depicted in FIG. 8). FIG. 8 illustrates the RMUX logic table 800 of RMUX 704 in accordance with one or more embodiments of the invention. In FIG. 8, "DC" is a "don't care" term, and in such cases for r_out, the term "DC" will cause MISMATCH to assert (i.e., be true). It is noted that that r_sel is only used to determine the value of r_out if both MATCH0 and MATCH1 are asserted (i.e., both are true), which means that MATCH0 and MATCH1 are both 1; otherwise, the RMUX logic table 800 denotes the value for r_out. If such a state is reached where MATCH0 and MATCH1 are both 1, one of the mutually exclusive cases holds below:

1) The valuation of Sns is always agnostic to "r", so either valuation of "r" results in the same Sns. In other words, the value of "r" does not matter.

2) The valuation of Sns sometimes depends on "r", but the set of CP.IN valuations that can be matched from the next state and all future states is the always same for all valuation of Sns.

3) The valuation of Sns sometimes depends on "r", and sometimes the set of CP.IN valuations that can be matched from the next state and all future states is not the same for all valuations of Sns.

If case 1) or 2), then monitor RE 900 is suitable to be used as a monitor. However, in case 3), monitor RE 900 is not yet suitable because earlier decisions for r_sel may affect which valuations of CP.IN are matched. Case 3) is further checked when discussing FIG. 9 below.

Software applications 230 initially operate according to FIGS. 6A, 7A, and 8 for the first random input elimination of "r", and subsequently iterate on processes for FIGS. 6B, 7BB, and 8 until all random bits, i.e., random values for "r", are eliminated from the input sequence of random bits R. Between iterations, software applications 230 apply standard Boolean simplification techniques to curb any potential exponential blowup of monitor RE 900. This procedure generates the R-eliminated (i.e., random bit R eliminated) monitor RE 900 depicted in FIG. 9. In FIG. 9, the combination of individual r_sel signals (e.g., previously stored in database 250) used to eliminate their respective random value for "r" are now referred to as the set R_SEL. In other words, R_SEL is a collection of all the determined values for r_sel, where each r_sel is for an eliminated "r" for a respective bit position in "R". As can be seen, combinational logic CIN0 602_0 and combinational logic CIN1 602_1 have been folded back into combinational logic CIN 602. The values of R_SEL are used to determine how monitor RE 900 generates signal IN to match signal CP.IN. Assuming that signal IN and signal CP.IN each have an equal bit length/bit width "N", software applications 230 are configured to process through values of R_SEL for "N" times. It has already been determined that row 1 of RMUX logic table 800 does not apply, from above. When combinational logic CSns 604 does not have to access row 4 of RMUX logic table 800, software applications 230 are configured to determine that it may be possible to delete R_SEL which would result in R_SEL not being needed for monitor RE 900. In order to verify that the sequential choices of R_SEL do not restrict the possible sequential drivings of signal IN output from combinational logic CIN 602, software applications 230 compare signal IN from monitor RE 900 to the original driver D as discussed in FIG. 10.

Further regarding folding combinational logic CIN0 602_0 and combinational logic CIN1 602_1 back into combinational logic CIN 602 is discussed. It should be appreciated that FIGS. 7A and 7B depict the elements for eliminating a single "r" in the sequence of random bits "R", and for each random bit "r" eliminated, the elements of FIGS. 7A and 7B of duplicated in the monitor RE 900. For a simple scenario, it is assumed that the bit width/bit length of the signal IN and signal CP.IN (which is signal SIM.IN in FIG. 11) is 2 bits which means that "R" was 2 bits, and therefore there is an "r" for the first bit (i.e., first bit position) and another "r" for the second bit (i.e., second bit position). To eliminate the first "r" in the random bits "R" of 2 bits in this example scenario, monitor RE 900 would include a first set of combinational logic CIN0 602_0 and combinational logic CIN1 602_1, a first set of match0 502_0 and match1 502_1, a first RMUX 704, a first combinational logic CSns 604, a first state memory element 306, a first Or 702, a first Not 504, and a first mismatch 506. Analogously, to eliminate the second "r" in the random bits "R" of 2 bits, monitor RE 900 would likewise include a second set of combinational logic CIN0 602_0 and combinational logic CIN1 602_1, a second set of match0 502_0 and match1 502_1, a second RMUX 704, a second combinational logic CSns 604, a second state memory element 306, a second Or 702, a second Not 504, and a second mismatch 506. Although this example scenario was only for 2 bits, if there were more than 2 bits, each eliminated bit "r" would have a set of the elements for the additional bits as discussed above. To result in the internally generated signal IN (shown as signals IN0 and IN1 in FIGS. 7A and 7B and combined into signal IN in FIG. 9) that is generated by monitor RE 900, another piece of logic with memory [not shown] captures the r_out from each RMUX 704 and combines into a sequence based on bit position to generate the internal signal IN. Additionally, the logic with memory [not shown] captures IN0 or IN1 from each set for the representative bit based on which "r" the particular RMUX 704 selected as correct for r_out, and the correct values for "r" are combined into a sequence based on bit position to generate the internal signal IN.

FIG. 10 illustrates a block diagram to check generality of monitor RE 900 according to one or more embodiments of the invention. FIG. 10 addresses case 3). With reference to FIG. 10, software applications 230 are configured to compare driver D to monitor RE as follows: assign port CP.IN of monitor RE 900 to receive signal D.IN from driver D; and perform a sequential equivalence check, where input R to driver D is random and is not tied to other random inputs, where R_SEL of monitor RE 900 is random and is not tied to other random inputs, where each matching input signal of OUT to monitor RE 900 and input signal OUT to driver D is driven random and identically.

Software applications 230 are configured to check target MISMATCH to determine if a mismatch occurred at mismatch 506 between signal IN generated internally (not shown) by monitor RE and signal D.IN from driver D received at port CP.IN of monitor RE 900. If MISMATCH is provably unhittable (i.e., proved to never be a mismatch at mismatch 506), then monitor RE 900 can match all sequences of signal D.IN that driver D allows regardless of the values of R_SEL, and monitor RE 900 is a complete monitor to use in simulation shown in FIG. 11.

However, if MISMATCH is hit, then there exists a choice of R_SEL that results in an input sequence for internal signal IN that cannot be matched to signal D.IN from driver D received at port CP.IN. In other words, there are valuations/values of signal IN that admit more than one valuation/value of Sns, and this nondeterminism can affect the set of valuations of signal IN at a future time. In this case, it may be that a different choice of R_SEL (other than random) will not hit MISMATCH (i.e., not be a mismatch). For example, software applications 230 could assign a constant 0 or 1 to an element of R_SEL such that there is not a hit on MISMATCH, but in other cases the deterministic choice may depend on signals in the logic of the associated RMUX. For practical drivers, this MISMATCH hit trace will illustrate to the user why the driver D does not have a deterministic next state when Sq, OUT, and IN are determined. This will guide the user to restructure or fix unintended behavior of driver D (e.g., DUT driving logic 1104).

According to one or more embodiments, additional configurations and extensions can include any combination of input subsetting, "R" subsetting, and/or constrains. For input subsetting, while the default mode is for the set of DUT input signals IN as those that are driven by D, any subset IN' of these signals may be used instead for scalability, in terms of either runtime or the size of the RE monitor. The resulting monitor will only check the sequence on IN' signals, and only those signals in R in the cone of influence of IN' need to be eliminated. For "R" subsetting, as another control for scalability, the user may specify only a subset of "R" to eliminate when creating monitor RE. In this case, the model comparison between original driver D and monitor RE now involves identical driving of R-signals that were not quantified away. However, this restriction renders the monitor RE susceptible to false hits of MISMATCH, as the "wrong" decision for existing R-signals may lead to a mismatch while the "right" decision would match. If a MISMATCH is not hit, this configuration can soundly conclude that driver D allows the simulation sequence on IN.

Figure 11:
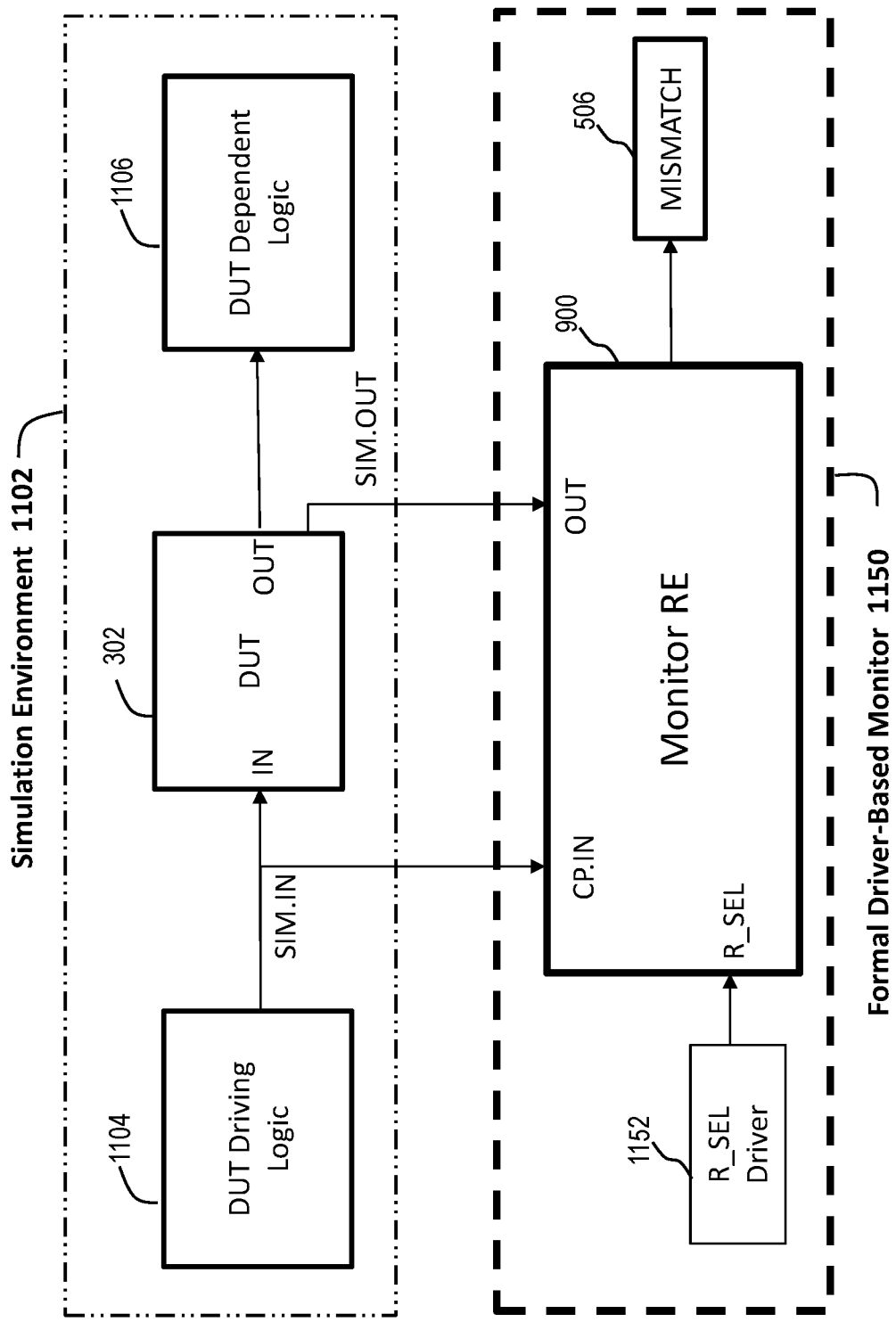
FIG. 11 depicts a block diagram illustrating use of the monitor as a simulation monitor in accordance with one or more embodiments of the present invention.

FIG. 11 is a block diagram illustrating use of monitor RE as a simulation monitor in accordance with one or more embodiments of the invention. Simulation software applications 240 are configured to run a simulation as understood by one skilled in the art. Software applications 230 may be integrated with, call, and/or invoke simulation software applications 240. If target MISMATCH was unhittable above (in FIG. 10), software applications 230 are configured to attach monitor RE 900 to a simulation environment 1102 by assigning port CP.IN to monitor RE 900 as the inputs to the DUT 302 driven during simulation, where port CP.IN receives signal SIM.IN from DUT driving logic 1104. If target MISMATCH is hit during simulation (i.e., MISMATCH 506 detects a mismatch), then the formal environment driver which is formal driver-based monitor 1150 conclusively cannot match the driving sequence of signal SIM.IN from DUT driving logic 1104. Simulation environment 1102 includes DUT dependent logic 1106 that receives output from DUT 302.

Formal driver-based monitor 1150 includes the built monitor RE 900 that receives values for R_SEL from R_SEL driver 1152. R_SEL driver 1152 includes the set of values previously determined for r_sel for each "r" of "R". MISMATCH 506 determines when there is a mismatch between the signal received at port CP.IN which is the signal SIM.IN from DUT driving logic 1104 and internal signal IN of monitor RE 900. The internal signal IN of monitor RE 900 is shown in FIG. 9 and also represents signals IN0 and IN1.

Figure 12:
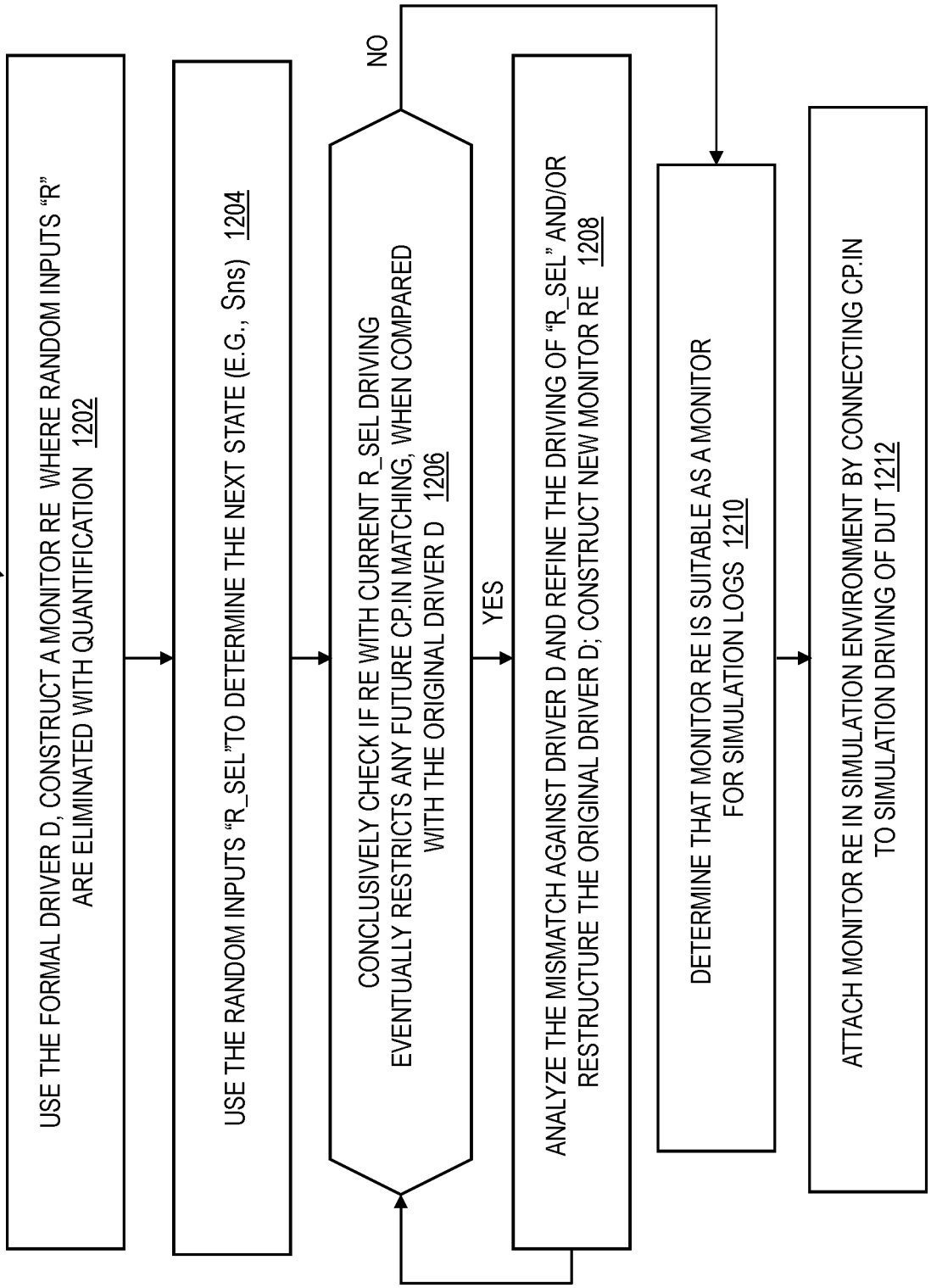
FIG. 12 a flowchart for converting a formal verification driver with nondeterministic inputs to a simulation monitor with deterministic inputs in accordance with one or more embodiments of the present invention.

FIG. 12 depicts a flowchart of converting a formal verification driver with nondeterministic inputs to a simulation monitor with deterministic inputs for use with a simulation environment for checking a design-under-test (DUT) in accordance with one or more embodiments of the invention. At block 1202, using the formal driver D, software applications 230 are configured to construct a monitor RE 900 where random inputs R are eliminated with quantification. This monitor RE 900 includes new input signals CP.IN, a copy of all inputs to be monitored, and new random inputs R_SEL equal in size (e.g., same bit width/bit length) to random input R. At block 1204, software applications 230 are configured to use the random inputs "R_SEL" to determine the next stage (e.g., Sns). At block 1206, software applications 230 are configured to conclusively check if this monitor RE 900 with current R_SEL driving eventually restricts any future CP.IN matching when compared with the original driver D (shown in FIGS. 3 and 10). The original driver D is defined as a formal verification driver with nondeterministic inputs. If ("No") the monitor RE 900 with current R_SEL driving does not eventually restrict any future CP.IN matching, this means that the given input sequence on CP.IN and thus the next state (e.g., Sns) of monitor RE 900 can be deterministically inferred from CP.IN, such that monitor RE 900 can use the random inputs R_SEL to determine the next state (e.g., Sns), and flow proceeds to block 1210. Software applications 230 are configured to determine that monitor RE 900 is suitable as a monitor for simulation at block 1210. At block 1212, software applications 230 are configured to attach monitor RE 900 to a simulation environment such that monitor RE 900 can flag input sequences that are not allowed by driver D, with minimal logic overhead. If ("Yes") the monitor RE 900 using the current R_SEL results in a restriction to any future CP.IN matching when compared with the original driver D, the user has the opportunity to analyze the mismatch against driver D and refine the driving of "R_SEL", and/or restructure the original driver D, at block 1208. Using software applications 230, the user can construct a new monitor RE 900. Flow then returns to block 1206. For example, for the mismatch, the value of R_SEL associated with a particular bit position that failed for a predetermined state Sq can be set to a value that does not result in the mismatch.

FIG. 13 is a flowchart of a method 1300 to convert an original formal verification driver D with nondeterministic inputs to a simulation monitor RE 900 with deterministic inputs according to one or more embodiments of the invention. At block 1302, software applications 230 are adapted to configure a sequential circuit monitor (e.g., monitor RE 900) to connect to a design under test (DUT) input interface (e.g., the IN port of DUT 302), the sequential circuit monitor having been generated by applying a quantifier elimination to each random bit position (e.g., random bit "r") of random bits/inputs (e.g., "R") associated with an original formal verification driver D, as depicted in FIGS. 7A, 7B, and 8. The original formal verification driver (e.g., in FIG. 3) characterizes and/or is configured to generate a set of nondeterministic (sequential) inputs. At block 1304, software applications 230 are configured to select a (Boolean)

value as an assignment (e.g., selection of r_out according to RMUX logic table 800) of the random bits/inputs (e.g., "R") to drive a next stage logic (e.g., combinational logic CSns 604) of the sequential circuit monitor (e.g., monitor RE 900), a state (e.g., current state Sq) of the next stage logic (e.g., combinational logic CSns 604) being used by the sequential circuit monitor (e.g., monitor RE 900) to generate sequential inputs (e.g., signal IN including signal IN0 and signal IN1) to match the nondeterministic (sequential) inputs permitted by the formal verification driver (e.g., to match signal D.IN received at the CP.IN interface/port of monitor RE 900). The original formal verification driver D is specified for a design under test (DUT) 302. Software applications 230 are configured to perform an equivalence check between the nondeterministic (sequential) inputs from the original formal verification driver D (e.g., signal D.IN which is the same as signal "IN" in FIG. 3) and the sequential inputs (e.g., signal IN including signal IN0 and signal IN1) of the sequential circuit monitor to verify (e.g., using match 502, Not 504, and mismatch 506) that a choice of the selected value is correct, as depicted in FIGS. 9 and 10. The equivalence check is a comparison for equivalent outputs between the sequential circuit simulation monitor and the formal verification driver in order to verify that the sequential circuit simulation monitor matches the same set of the nondeterministic inputs permitted by the original formal verification driver D. At block 1306, software applications 230 are configured to couple the sequential circuit monitor (e.g., monitor RE 900) to a simulation environment (e.g., DUT driving logic 1104) and the DUT 302 in a simulation environment, the sequential circuit monitor being configured to flag an input sequence (e.g., SIM.IN) from the simulation environment (e.g., DUT driving logic 1104) not permitted by the original driver D based on the sequential inputs (e.g., signal IN including signal IN0 and signal IN1).

The sequential circuit monitor (e.g., monitor RE 900) is configured to check the input sequence (e.g., SIM.IN) from the simulation environment (e.g., DUT driving logic 1104) against the sequential inputs (e.g., IN). A mismatch is determined when the input sequence (e.g., SIM.IN) from the simulation environment is not permitted to by the original formal verification driver D (i.e., the input sequence cannot be matched on by the sequential input (i.e., signal IN generated internally by monitor RE 900). A simulation (via simulation software applications 240 and/or software applications 230) in the simulation environment is discontinued upon determining the mismatch.

Selecting the value (or Boolean assignment) (e.g., selection for r_out) of the random inputs/bits to drive the next stage logic comprises selecting a first value or a second value (e.g., 0 or 1, or vice versa) for the selected value based on a bit value previously used to match a bit position in a corresponding random input (e.g., based on RMUX logic table 800 for the particular bit position. Selecting the value of the random inputs to drive the next stage logic comprises using multiplexer logic (of RMUX 704) that selects values to correspond to a match of monitored values (e.g., signal SIM.IN which is sent to both the CP.IN port of monitor RE 900 along with the IN port of DUT 302) from the simulation environment to the DUT input interface. The sequential circuit simulation monitor is configured to utilize and/or check a subset of the sequential inputs (e.g., a subset of IN). The sequential circuit simulation monitor is configured to utilize and/or check a quantifier eliminated subset of the random inputs (e.g., a subset of "R").

Figure 14B:
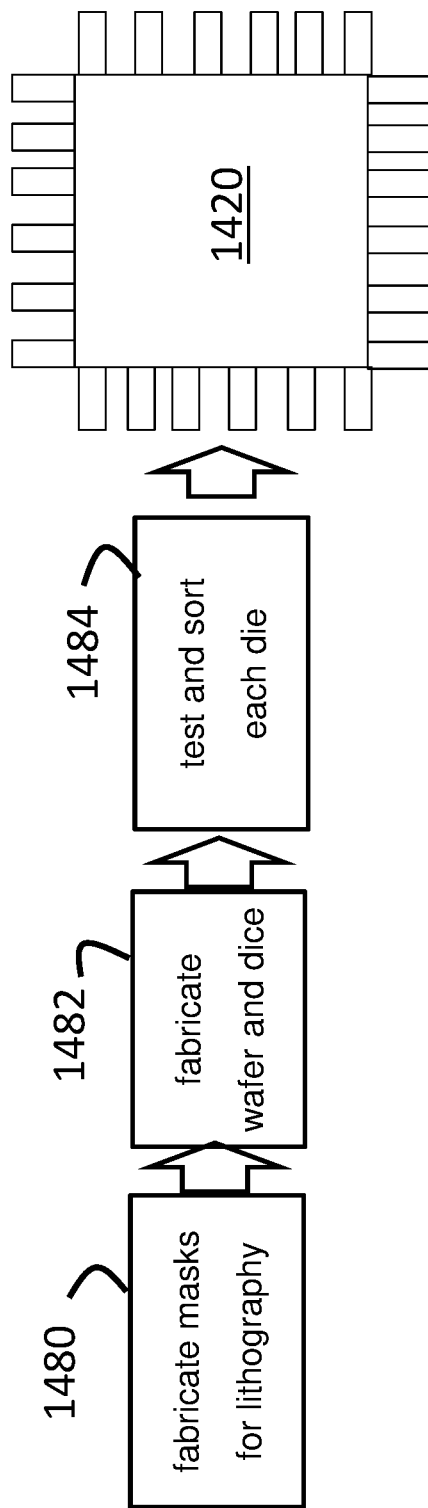
FIG. 14B is a process flow of a method of fabricating the integrated circuit of the DUT according to one or more embodiments of the invention.

FIG. 14A is a block diagram of a system 1400 to fabricate the DUT 302 having had its input IN monitored by monitor RE 900 during simulation according to embodiments of the invention. The system 1400 includes processing circuitry 1410 used to generate the design that is ultimately fabricated into an integrated circuit 1420. The steps involved in the fabrication of the integrated circuit 1420 are well-known and briefly described herein. Once the physical layout is finalized, based, in part, on the DUT 302 having had its input IN monitored by monitor RE 900 during simulation according to embodiments of the invention to facilitate optimization of the routing plan, the finalized physical layout is provided to a foundry. Masks are generated for each layer of the integrated circuit based on the finalized physical layout. Then, the wafer is processed in the sequence of the mask order. The processing includes photolithography and etch. This is further discussed with reference to FIG. 14B. FIG. 14B is a process flow of a method of fabricating the integrated circuit according to exemplary embodiments of the invention. Once the physical design data is obtained, based, in part, on the DUT 302 having had its input IN monitored by monitor RE 900 during simulation, the integrated circuit 120 can be fabricated according to known processes that are generally described with reference to FIG. 14B. Generally, a wafer with multiple copies of the final design is fabricated and cut (i.e., diced) such that each die is one copy of the integrated circuit 1420. At block 1480, the processes include fabricating masks for lithography based on the finalized physical layout. At block 1482, fabricating the wafer includes using the masks to perform photolithography and etching. Once the wafer is diced, testing and sorting each die is performed, at block 1484, to filter out any faulty die.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 15:
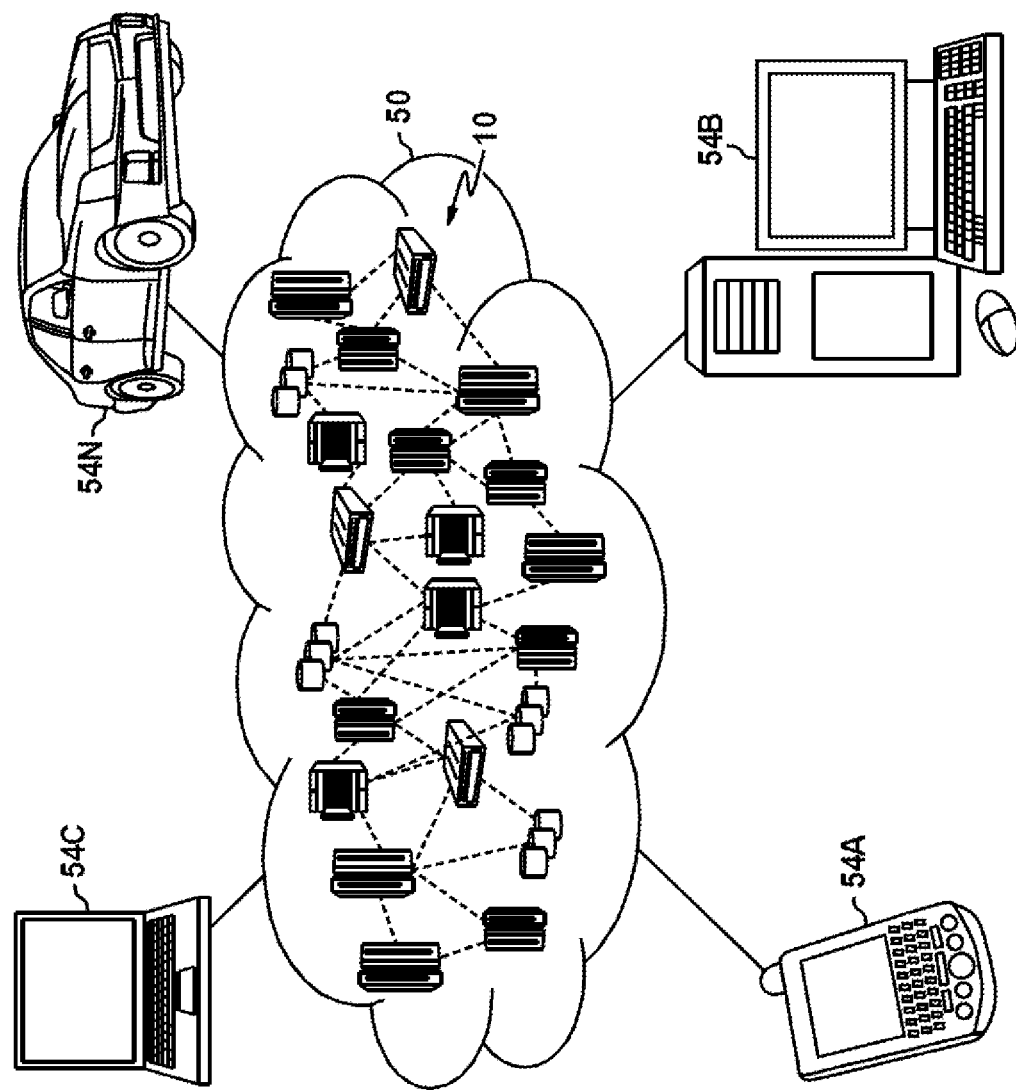
FIG. 15 depicts a cloud computing environment according to one or more embodiments of the present invention.

Referring now to FIG. 15, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described herein above, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 15 are intended to be illustrative only and that computing nodes 10 and cloud computing environment 50 can communicate with any type of computerized device over any type of network and/or network addressable connection (e.g., using a web browser).

Figure 16:
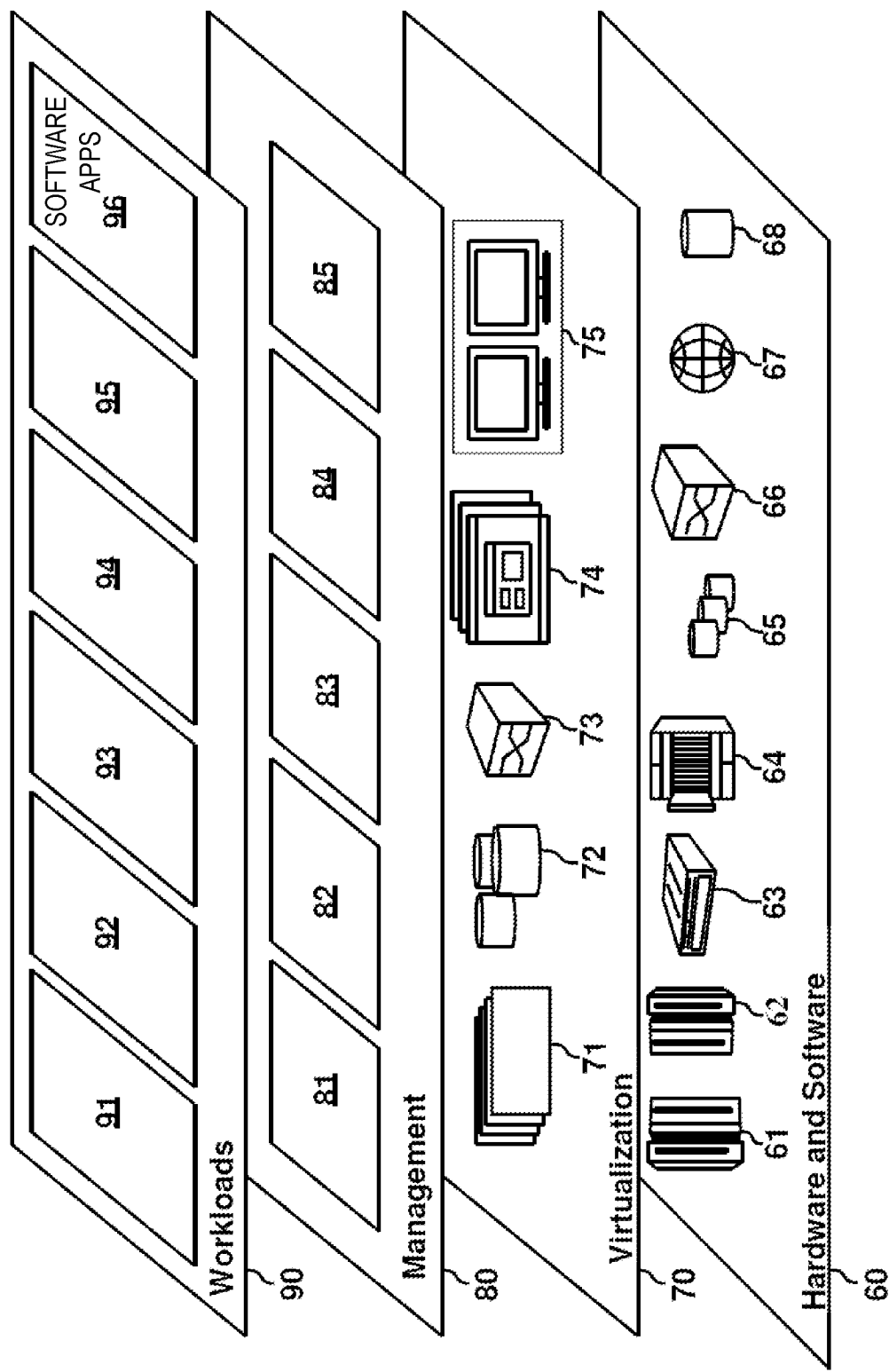
FIG. 16 depicts abstraction model layers according to one or more embodiments of the present invention.

Referring now to FIG. 16, a set of functional abstraction layers provided by cloud computing environment 50 (FIG. 15) is shown. It should be understood in advance that the components, layers, and functions shown in FIG. 16 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and software applications 96 (e.g., software applications 230, simulation software applications 240, etc.). Also, software applications can function with and/or be integrated with Resource provisioning 81.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method comprising:
configuring a sequential circuit simulation monitor for a design under test (DUT) input interface, the sequential circuit simulation monitor having been generated by applying a quantifier elimination to each random bit position of random inputs associated with an original formal verification driver, the original formal verification driver being configured to generate a set of nondeterministic inputs;
selecting a value for the random inputs to drive a next stage logic of the sequential circuit simulation monitor, a state of the next stage logic being used by the sequential circuit simulation monitor to generate sequential inputs to match the nondeterministic inputs permitted by the original formal verification driver;
wherein a comparison for equivalent outputs between the sequential circuit simulation monitor and the original formal verification driver verifies that the sequential circuit simulation monitor matches the set of the nondeterministic inputs permitted by the original formal verification driver; and coupling the sequential circuit simulation monitor to a simulation environment and the DUT in the simulation environment, the sequential circuit simulation monitor being configured to flag an input sequence from the simulation environment not permitted by the original formal verification driver based on the sequential inputs.

2. The computer-implemented method of claim 1, wherein the sequential circuit simulation monitor is configured to check the input sequence from the simulation environment against the sequential inputs.

3. The computer-implemented method of claim 1, wherein a mismatch is determined when the input sequence from the simulation environment is not permitted by the original formal verification driver.

4. The computer-implemented method of claim 3, wherein a simulation in the simulation environment is discontinued upon determining the mismatch.

5. The computer-implemented method of claim 1, wherein selecting the value of the random inputs to drive the next stage logic comprises using multiplexer logic that selects values that correspond to a match of monitored values from the simulation environment to the DUT input interface.

6. The computer-implemented method of claim 1, wherein the sequential circuit simulation monitor is configured to check a subset of the sequential inputs.

7. The computer-implemented method of claim 1, wherein the sequential circuit simulation monitor is configured to have a quantifier eliminated subset of the random inputs.

8. A system comprising:
a memory having computer readable instructions; and
one or more processors for executing the computer readable instructions, the computer readable instructions controlling the one or more processors to perform operations comprising:
configuring a sequential circuit simulation monitor for a design under test (DUT) input interface, the sequential circuit simulation monitor having been generated by applying a quantifier elimination to each random bit position of random inputs associated with an original formal verification driver, the original formal verification driver being configured to generate a set of nondeterministic inputs;
selecting a value for the random inputs to drive a next stage logic of the sequential circuit simulation monitor, a state of the next stage logic being used by the sequential circuit simulation monitor to generate sequential inputs to match the nondeterministic inputs permitted by the original formal verification driver;
wherein a comparison for equivalent outputs between the sequential circuit simulation monitor and the original formal verification driver verifies that the sequential circuit simulation monitor matches the set of the nondeterministic inputs permitted by the original formal verification driver; and
coupling the sequential circuit simulation monitor to a simulation environment and the DUT in the simulation environment, the sequential circuit simulation monitor being configured to flag an input sequence from the simulation environment not permitted by the original formal verification driver based on the sequential inputs.

9. The system of claim 8, wherein the sequential circuit simulation monitor is configured to check the input sequence from the simulation environment against the sequential inputs.

10. The system of claim 8, wherein a mismatch is determined when the input sequence from the simulation environment is not permitted by the original formal verification driver.

11. The system of claim 10, wherein a simulation in the simulation environment is discontinued upon determining the mismatch.

12. The system of claim 8, wherein selecting the value of the random inputs to drive the next stage logic comprises using multiplexer logic that selects values that correspond to a match of monitored values from the simulation environment to the DUT input interface.

13. The system of claim 8, wherein the sequential circuit simulation monitor is configured to check a subset of the sequential inputs.

14. The system of claim 8, wherein the sequential circuit simulation monitor is configured to have a quantifier eliminated subset of the random inputs.

15. A computer program product comprising a computer readable storage medium having program instructions embodied therewith, the program instructions executable by a processor to cause the processor to perform operations comprising:
configuring a sequential circuit simulation monitor for a design under test (DUT) input interface, the sequential circuit simulation monitor having been generated by applying a quantifier elimination to each random bit position of random inputs associated with an original formal verification driver, the original formal verification driver being configured to generate a set of nondeterministic inputs;
selecting a value for the random inputs to drive a next stage logic of the sequential circuit simulation monitor, a state of the next stage logic being used by the sequential circuit simulation monitor to generate sequential inputs to match the nondeterministic inputs permitted by the original formal verification driver;
wherein a comparison for equivalent outputs between the sequential circuit simulation monitor and the original formal verification driver verifies that the sequential circuit simulation monitor matches the set of the nondeterministic inputs permitted by the original formal verification driver; and
coupling the sequential circuit simulation monitor to a simulation environment and the DUT in the simulation environment, the sequential circuit simulation monitor being configured to flag an input sequence from the simulation environment not permitted by the original formal verification driver based on the sequential inputs.

16. The computer program product of claim 15, wherein the sequential circuit simulation monitor is configured to check the input sequence from the simulation environment against the sequential inputs.

17. The computer program product of claim 15, wherein a mismatch is determined when the input sequence from the simulation environment is not permitted by the original formal verification driver.

18. The computer program product of claim 17, wherein a simulation in the simulation environment is discontinued upon determining the mismatch.

19. The computer program product of claim 15, wherein selecting the value of the random inputs to drive the next stage logic comprises using multiplexer logic that selects values that correspond to a match of monitored values from the simulation environment to the DUT input interface.

20. The computer program product of claim 15, wherein:
the sequential circuit simulation monitor is configured to utilize a subset of the sequential inputs;
the sequential circuit simulation monitor is configured to check a subset of the random inputs; and
the sequential circuit simulation monitor is configured to have a quantifier eliminated the subset of the sequential inputs and the subset of the random inputs.

* * * * *